US012603218B2

(12) United States Patent
Lai et al.

(10) Patent No.: US 12,603,218 B2
(45) Date of Patent: Apr. 14, 2026

(54) PLANAR TRANSFORMER

(71) Applicants: Chicony Power Technology Co., Ltd., New Taipei City (TW); National Taipei University of Technology, Taipei (TW)

(72) Inventors: Yen-Shin Lai, Taipei City (TW); Yong-Yi Huang, Taipei City (TW); Hao-Chieh Chang, New Taipei City (TW)

(73) Assignees: CHICONY POWER TECHNOLOGY CO., LTD., New Taipei City (TW); NATIONAL TAIPEI UNIVERSITY OF TECHNOLOGY, Taipei (TW)

( * ) Notice: Subject to any disclaimer, the term of this patent is extended or adjusted under 35 U.S.C. 154(b) by 1154 days.

(21) Appl. No.: 17/552,811

(22) Filed: Dec. 16, 2021

(65) Prior Publication Data

US 2023/0094775 A1 Mar. 30, 2023

(30) Foreign Application Priority Data

Sep. 24, 2021 (TW) ................................. 110135700

(51) Int. Cl.
*H01F 27/28* (2006.01)
*H05K 1/16* (2006.01)

(52) U.S. Cl.
CPC ......... *H01F 27/2804* (2013.01); *H05K 1/165* (2013.01); *H01F 2027/2809* (2013.01); *H01F 2027/2819* (2013.01)

(58) Field of Classification Search
CPC ......... H01F 27/2804; H01F 2027/2809; H01F 2027/2814; H01F 2027/2819; H01F 17/0006; H01F 17/0013; H01F 17/0033; H01F 5/003; H01F 17/04; H01F 27/24; H05K 1/165; H05K 1/0298; H05K 2201/086
USPC .................................................. 336/200, 232
See application file for complete search history.

(56) References Cited

U.S. PATENT DOCUMENTS

| | | | |
|---|---|---|---|
| 7,999,650 B2 | 8/2011 | Mori | |
| 10,163,561 B1 * | 12/2018 | Feno | ..................... H01F 27/346 |
| 10,546,914 B1 | 1/2020 | Nguyen et al. | |
| 2002/0070834 A1 | 6/2002 | Dadafshar | |

(Continued)

FOREIGN PATENT DOCUMENTS

| | | |
|---|---|---|
| CN | 201138608 | 10/2008 |
| CN | 102237187 | 11/2011 |
| CN | 105869855 | 8/2016 |

(Continued)

*Primary Examiner* — Tszfung J Chan
(74) *Attorney, Agent, or Firm* — Birch, Stewart, Kolasch & Birch, LLP

(57) ABSTRACT

A printed circuit board of a planar transformer includes a first column hole, a second column hole, and a plurality of winding layers. At least one of the winding layers includes a first winding and a second winding connected in series. The first winding surrounds the first column hole and has a first opening direction. The second winding surrounds the second column hole and has a second opening direction. The first opening direction is different from the second opening direction. Consequently, the windings on the plurality of layers may be connected in series through conductive holes of the PCB to increase the number of winding turns.

4 Claims, 18 Drawing Sheets

(56)     References Cited

U.S. PATENT DOCUMENTS

2005/0110606 A1 *   5/2005  Vinciarelli ......... H01F 27/2804
                                                336/200
2019/0075657 A1     3/2019  Esposito

FOREIGN PATENT DOCUMENTS

EP          2863429          4/2015
JP          2010050160 A  *  3/2010
TW          201505045        2/2015
TW          201837932       10/2018

* cited by examiner

197 } 190

PLANAR TRANSFORMER

CROSS-REFERENCE TO RELATED APPLICATION

This non-provisional application claims priority under 35 U.S.C. § 119(a) to Patent Application No. 110135700 filed in Taiwan, R.O.C. on Sep. 24, 2021, the entire contents of which are hereby incorporated by reference.

BACKGROUND

Technical Field

The present disclosure relates to a transformer, and specifically, to a planar transformer.

Related Art

Many electrical appliances use a transformer to adjust an inputted voltage to a required voltage. A general transformer includes a high voltage side coil and a low voltage side coil. The high voltage side coil receives an alternating current to generate a magnetic field, the low voltage side coil generates an inductive potential difference in response to the magnetic field, and the transformer obtains, according to a turns ratio of the high voltage side coil to the low voltage side coil, a converted voltage.

Currently, more and more electrical appliances require a small volume, which leads to a decrease in a volume of the transformer. Compared with conventional transformers, a planar transformer has a characteristic of small volume. Therefore, planar transformers are frequently used in an application scenario with limited space.

SUMMARY

In view of this, according to some embodiments, a planar transformer including a printed circuit board is provided. The printed circuit board includes a plurality of winding layers, a first column hole, and a second column hole. Each winding layer includes a first column winding region and a second column winding region. The first column hole passes through the first column winding regions, and the second column hole passes through the second column winding regions. The winding layers include a first layer and a second layer. The first layer includes a first winding and a second winding. The first winding of the first layer is located in the first column winding region of the first layer, surrounds the first column hole, and has a first opening direction; and the second winding of the first layer is located in the second column winding region of the first layer, surrounds the second column hole, and has a second opening direction. The first winding of the first layer is electrically connected to the second winding of the first layer, and the first opening direction of the first layer is different from the second opening direction of the first layer. The second layer includes a first winding and a second winding. The first winding of the second layer is located in the first column winding region of the second layer, surrounds the first column hole, and has a first opening direction; and the second winding of the second layer is located in the second column winding region of the second layer, surrounds the second column hole, and has a second opening direction. The first winding of the second layer is electrically connected to the second winding of the second layer, and the first opening direction of the second layer is different from the second opening direction of the second layer.

According to some embodiments, the first winding of the first layer is located on a first side of the first column hole, and the second winding of the first layer is located on a second side of the second column hole. The first winding of the second layer is located on a second side of the first column hole, and the second winding of the second layer is located on a first side of the second column hole. The first side of the first column hole is opposite to the second side of the first column hole. The first side of the second column hole is opposite to the second side of the second column hole.

According to some embodiments, each winding layer includes a first extending region and a second extending region. The printed circuit board includes a second conductive hole, and the second conductive hole passes through the second extending regions. The first winding of the first layer extends to the first extending region of the first layer, the second winding of the first layer and the second winding of the second layer are electrically connected through the second conductive hole, and the first winding of the second layer extends to the first extending region of the second layer.

According to some embodiments, the winding layers additionally include a third layer. The third layer includes a first winding and a second winding. The first winding of the third layer is located in the first column winding region of the third layer, surrounds the first column hole, and has a first opening direction; and the second winding of the third layer is located in the second column winding region of the third layer, surrounds the second column hole, and has a second opening direction. The first winding of the third layer is electrically connected to the second winding of the third layer. The first opening direction of the third layer is different from the second opening direction of the third layer.

According to some embodiments, the printed circuit board includes a first conductive hole and a second conductive hole. The first conductive hole passes through the first extending regions, and the second conductive hole passes through the second extending regions. The first winding of the first layer extends to the first extending region of the first layer. The second winding of the first layer and the second winding of the second layer are electrically connected through the second conductive hole. The first winding of the second layer and the first winding of the third layer are electrically connected through the first conductive hole, and the second winding of the third layer extends to the second extending region of the third layer.

Based on the above, according to some embodiments, the winding layers of the planar transformer include first windings and second windings connected in series. The first winding and the second winding have different opening directions. A winding direction in which the first winding surrounds the first column hole is opposite to a winding direction in which the second winding surrounds the second column hole. Therefore, a designer may adjust opening directions of windings to cooperate with a high voltage side circuit, a low voltage side circuit, and a circuit layout requirement, to increase the design flexibility. In some embodiments, the conductive hole passes through the extending regions, and the windings of the plurality of winding layers are electrically connected through the conductive hole. Therefore, the conductive hole does not need to be configured in the column winding region, so that circuit layout is more flexible. In some embodiments, the conductive holes are all plated through holes, so that the printed circuit board of the planar transformer has no buried via hole or blind via hole, so that the printed circuit board has lower manufacture costs, a high yield rate, and high reliability.

DETAILED DESCRIPTION

Figure 1:
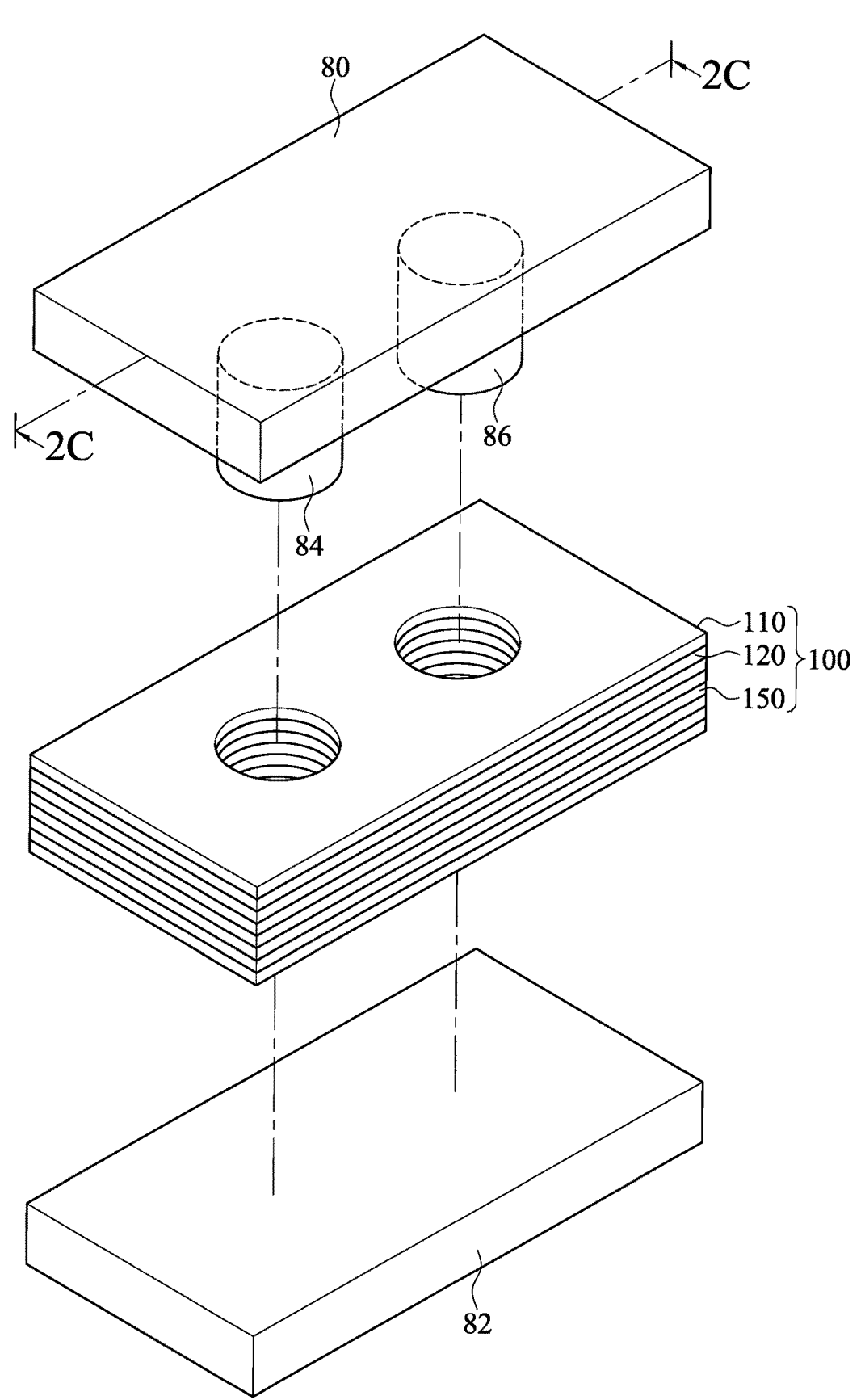
FIG. 1 is a three-dimensional exploded view of a planar transformer according to some embodiments.
Figure 2A:
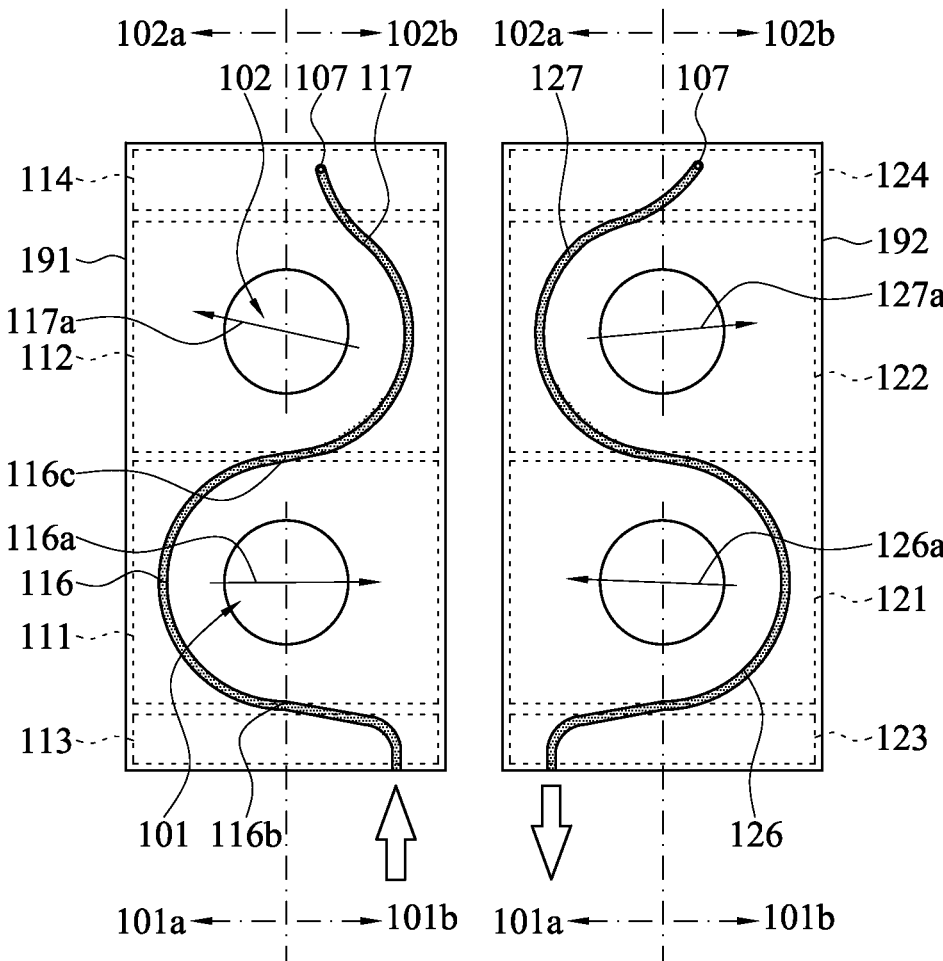
FIG. 2A is a top view of two winding layers according to some embodiments.

Referring to FIG. 1 and FIG. 2A together, FIG. 1 is a three-dimensional exploded view of a planar transformer according to some embodiments, FIG. 2A is a top view of two winding layers according to some embodiments, and FIG. 2A shows two winding layers vertically stacked in a parallel manner. The planar transformer includes a printed circuit board 100. The printed circuit board 100 includes a plurality of winding layers 110, 120, and 150, a first column hole 101, and a second column hole 102. Each winding layer 110 or 120 includes a first column winding region 111 or 121 and a second column winding region 112 or 122. The first column hole 101 passes through the first column winding regions 111 and 121, and the second column hole 102 passes through the second column winding regions 112 and 122.

In the embodiment of FIG. 2A, the printed circuit board 100 includes two winding layers 110 and 120. The winding layers 110 and 120 include a first layer 110 and a second layer 120 (which may be also referred to as a first winding layer and a second winding layer respectively throughout this specification). The first layer 110 includes a first winding 116 and a second winding 117. The first winding 116 of the first layer 110 is located in the first column winding region 111 of the first layer 110, surrounds the first column hole 101, and has a first opening direction 116a. The second winding 117 of the first layer 110 is located in the second column winding region 112 of the first layer 110, surrounds the second column hole 102, and has a second opening direction 117a. The first winding 116 of the first layer 110 is electrically connected to the second winding 117 of the first layer 110. The first opening direction 116a of the first layer 110 is different from the second opening direction 117a of the first layer 110. The second layer 120 includes a first winding 126 and a second winding 127. The first winding 126 of the second layer 120 is located in the first column winding region 121 of the second layer 120, surrounds the first column hole 101, and has a first opening direction 126a. The second winding 127 of the second layer 120 is located in the second column winding region 122 of the second layer 120, surrounds the second column hole 102, and has a second opening direction 127a. The first winding 126 of the second layer 120 is electrically connected to the second winding 127 of the second layer 120, and the first opening direction 126a of the second layer 120 is different from the second opening direction 127a of the second layer 120.

The column winding regions 111, 112, 121, and 122 are regions provided for the windings 116, 117, 126, and 127 to surround. In the embodiment of FIG. 2A, the column winding regions 111, 112, 121, and 122 are in a shape of a rectangle, but the shapes of the column winding regions 111, 112, 121, and 122 are not limited thereto, and the column winding regions 111, 112, 121, and 122 may be alternatively in a circular, ellipsoidal, or irregular shape surrounding the column holes 101 and 102. The windings 116, 117, 126, and 127 surround the column holes 101 and 102 in the column winding regions 111, 112, 121, and 122 and respectively have an opening. Therefore, angles at which the windings 116, 117, 126, and 127 surround the column holes 101 and 102 may range from 10 degrees to approximately 360 degrees (examples will be provided later), and are determined according to a layout plan requirement. The layout plan requirement includes, but is not limited to, a layout plane requirement of electrical connection between the two winding layers, or a layout plane requirement of electrical connection between the windings and a high voltage side circuit or a low voltage side circuit (details will be described later).

The first opening direction 116a of the first winding 116 of the first layer 110 refers to an opening direction of an arc formed by the first winding 116. The arc is an arc (also may be referred to as a winding arc) formed by the first winding 116 surrounding the first column hole 101. The winding arc includes two endpoints 116b and 116c, and the two endpoints 116b and 116c may be intersection points between the first winding 116 and the first column winding region 111, or may be endpoints of an actual opening of the first winding 116 (which will be explained later). A connecting line between the two endpoints 116b and 116c is a chord of the first winding 116. The first opening direction 116a of the first winding 116 is a direction that is perpendicular to the chord of the first winding 116, and faces outward. Meanings of the second opening direction 117a of the first layer 110, the first opening direction 126a of the second layer 120, and the second opening direction 127a of the second layer 120 are the same, and details are not described again.

For each layer 110 or 120, a winding direction of the first winding 116 or 126 is opposite to a winding direction of the second winding 117 or 127. That is, based on that the first winding 116 of the first layer 110 is electrically connected to the second winding 117 of the first layer 110, and the first winding 126 of the second layer 120 is electrically connected to the second winding 127 of the second layer 120. Therefore, the first winding 116 or 126 and the second winding 117 or 127 of each layer 110 or 120 are connected in series. If a current is inputted into one end of two ends connected in series, and the current flows out of the other end, for each layer 110 or 120, the winding direction of the first winding 116 or 126 is opposite to the winding direction of the second winding 117 or 127. For example, if a current is inputted into the first winding 116 of the first layer 110 and the current is outputted from the second winding 117 of the first layer 110, the winding direction of the first winding 116 of the first layer 110 is clockwise (based on the viewing angle in FIG. 2A), the winding direction of the second winding 117 of the first layer 110 is anticlockwise (based on the viewing angle in FIG. 2A), and the two winding directions are opposite. Similarly, the winding direction of the first winding 126 of the second layer 120 and the winding direction of the second winding 127 of the second layer 120 are opposite.

In the embodiment of FIG. 2A, the first opening direction 116a of the first layer 110 approximately faces toward a right side of the viewing angle in FIG. 2A, the second opening direction 117a of the first layer 110 approximately faces toward the upper left of the viewing angle in FIG. 2A, and the two directions are different. The first opening direction 126a of the second layer 120 approximately faces toward a left side of the viewing angle in FIG. 2A, the second opening direction 127a of the second layer 120 approximately faces toward the right side of the viewing angle in FIG. 2A, and the two directions are different. In addition, winding arcs respectively formed by the first winding 116 of the first layer 110, the second winding 117 of the first layer 110, the first winding 126 of the second layer 120, and the second winding 127 of the second layer 120 may be designed as required, and lengths of the arcs may be the same or different (details will be described later).

According to some embodiments, the first winding 116 of the first layer 110 is located on a first side 101a of the first column hole 101. The second winding 117 of the first layer 110 is located on a second side 102b of the second column hole 102. The first winding 126 of the second layer 120 is located on a second side 101b of the first column hole 101. The second winding 127 of the second layer 120 is located on a first side 102a of the second column hole 102. The first side 101a of the first column hole 101 is opposite to the second side 101b of the first column hole 101. The first side 102a of the second column hole 102 is opposite to the second side 102b of the second column hole 102.

Figure 7:
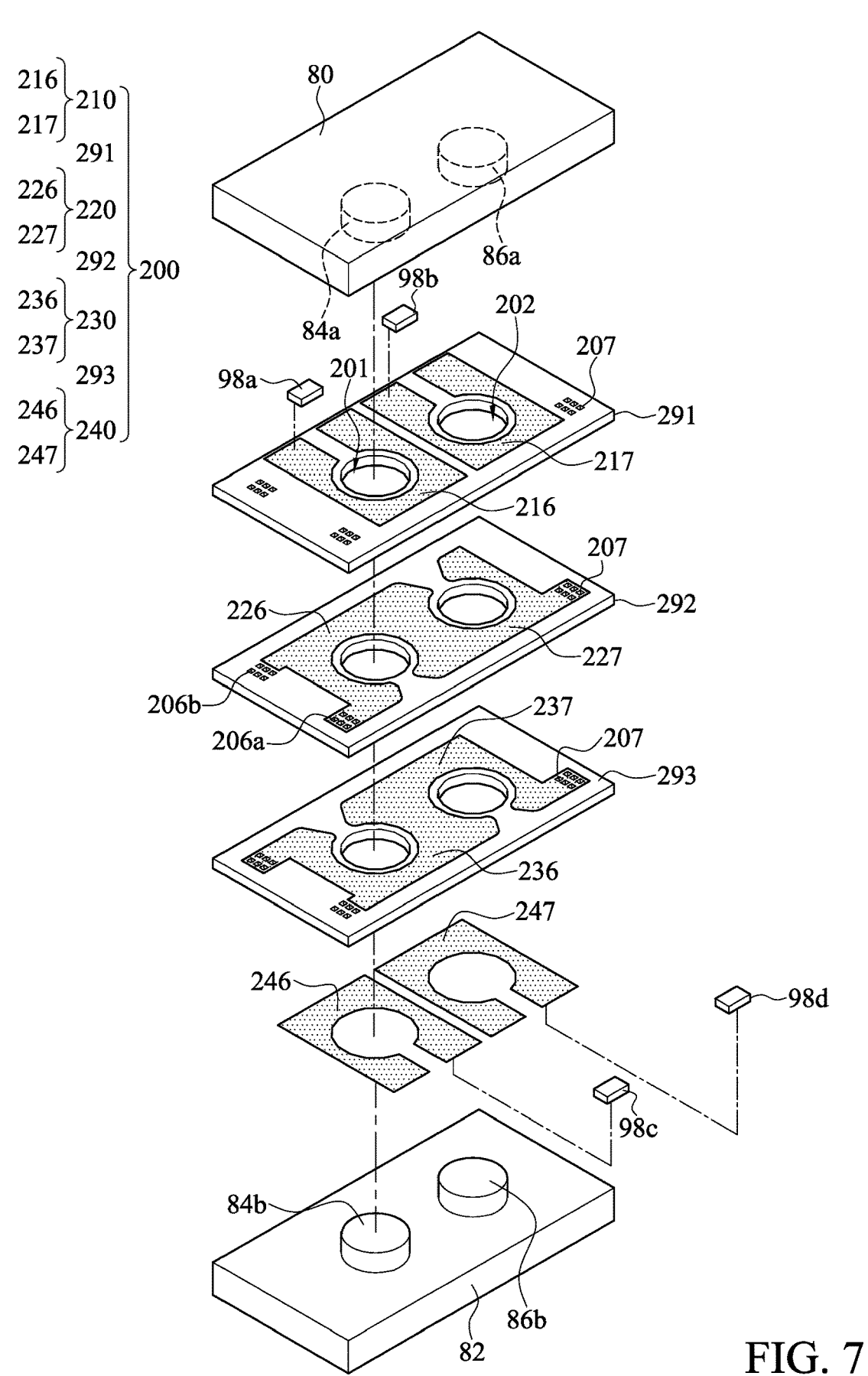
FIG. 7 is a three-dimensional exploded view of a planar transformer according to some embodiments.

In some embodiments, each winding layer 110 or 120 is located on a surface of an insulating layer 191 or 192 of the printed circuit board 100. In the embodiment of FIG. 2A, the first layer 110 is located on a surface of a first insulating layer 191, and the second layer 120 is located on a surface of a second insulating layer 192. However, the first layer and the second layer are not limited thereto. The first layer 110 and the second layer 120 may be respectively located on an upper surface and a lower surface of the same insulating layer. For example, a third layer 230 and a fourth layer 240 in an embodiment of FIG. 7 are respectively located on an upper surface and a lower surface of a third insulating layer 293 (details will be described later). Each column winding region 111, 112, 121, or 122 corresponds to a surface on which the winding 116, 117, 126, or 127 is located (alternatively, each column winding region 111, 112, 121, or 122 is located in a region of a surface on which the winding 116, 117, 126, or 127 is located). For example, the windings 116 and 117 of the first layer 110 are located on the surface of the first insulating layer 191, so that the column winding regions 111 and 112 of the first layer 110 correspond to the surface of the first insulating layer 191; and the windings 126 and 127 of the second layer 120 are located on the surface of the second insulating layer 192, so that the column winding regions 121 and 122 of the second layer 120 correspond to the surface of the second insulating layer 192.

Still referring to FIG. 1, in some embodiments, the planar transformer includes a first magnetic core 80, a second magnetic core 82, a first magnetic column 84, and a second magnetic column 86. The first magnetic column 84 and the second magnetic column 86 are respectively connected to the first magnetic core 80. The first magnetic column 84, the first magnetic core 80, and the second magnetic column 86 are three separate components sequentially connected or a single component integrally formed. In some embodiments, the first magnetic column 84 and the second magnetic column 86 are respectively connected to the second magnetic core 82. The first magnetic column 84, the second magnetic core 82, and the second magnetic column 86 are three separate components sequentially connected or a single component integrally formed. In some embodiments, the first magnetic column 84 and the second magnetic column 86 are not connected to the first magnetic core 80 or the second magnetic core 82 (for example, there is a small gap between the components), but are both located between the first magnetic core 80 and the second magnetic core 82. In some embodiments (referring to FIG. 7), the planar transformer includes two first sub-magnetic columns 84a and 84b and two second sub-magnetic columns 86a and 86b, where the two first sub-magnetic columns 84a and 84b are substantially configured coaxially, and the two second sub-magnetic columns 86a and 86b are substantially configured coaxially. The first sub-magnetic column 84a, the first magnetic core 80, and the second sub-magnetic column 86a are three separate components sequentially connected or a single component integrally formed. The first sub-magnetic column 84b, the second magnetic core 82, and the second sub-magnetic column 86b are three separate components sequentially connected or a single component integrally formed.

In some embodiments, each winding layer 110, 120, or 150 includes a first extending region 113 or 123 and a second extending region 114 or 124. The first winding 116 of the first layer 110 extends to the first extending region 113 of the first layer 110, and the first winding 126 of the second layer 120 extends to the first extending region 123 of the second layer 120. Based on this, the planar transformer may be electrically connected to the outside of the printed circuit board 100 or an electronic component through the first winding 116 or 126 of the first extending region 113 or 123. Similarly, the second winding 117 of the first layer 110 extends to the second extending region 114 of the first layer 110, the second winding 127 of the second layer 120 extends to the second extending region 124 of the second layer 120, and the purpose thereof are not described again.

In some embodiments, a connecting line between a center of a circle of the first column hole 101 and a center of a circle of the second column hole 102 passes through the first extending region 113 and the second extending region 114, and the first extending region 113, the first column winding region 111, the second column winding region 112, and the second extending region 114 are arranged sequentially.

In some embodiments, the printed circuit board 100 includes a second conductive hole 107. The second conductive hole 107 passes through the second extending regions 114 and 124 (alternatively, the second conductive hole 107 is located in the second extending regions 114 and 124), and the second winding 117 of the first layer 110 and the second winding 127 of the second layer 120 are electrically connected through the second conductive hole 107. In some embodiments, the second winding 117 of the first layer 110 extends to the second extending region 114 of the first layer 110 to be electrically connected to the second conductive hole 107, and the second winding 127 of the second layer 120 extends to the second extending region 124 of the second layer 120 to be electrically connected to the second conductive hole 107 (as shown in FIG. 2A). In some embodiments, the second conductive hole 107 is located at an edge (for example, an upper side of a view of FIG. 2A) of the second extending region 114 or 124 adjacent to the second column winding region 112 or 122 or the second extending region 114 or 124 adjacent to the printed circuit board 100, and the second winding 117 of the first layer 110 and the second winding 127 of the second layer 120 extends to the corresponding second extending regions 114 and 124 according to a position of the second conductive hole 107. In this embodiment, the second conductive hole 107 is merely located in the second extending regions 114 and 124, and there is no conductive hole in the column winding regions 111, 112, 121, and 122.

According to some embodiments, referring to FIG. 2A, the first winding 116 of the first layer 110, the second winding 117 of the first layer 110, the second winding 127 of the second layer 120, and the first winding 126 of the second layer 120 of the printed circuit board 100 are sequentially connected in series. A part of the first winding 116 of the first layer 110 extending to the first extending region 113 of the first layer 110 and a part of the first winding 126 of the second layer 120 extending to the first extending region 123 of the second layer 120 (for example, two arrows shown in the bottom of FIG. 2A, and directions of the arrows represent possible directions in which a current flows in and out) may be configured to be electrically connected to the outside of the printed circuit board 100 or the electronic component.

In this embodiment, the second winding 117 of the first layer 110 and the second winding 127 of the second layer 120 are electrically connected through the second conductive hole 107. The winding directions of the first windings 116 and 126 corresponding to the first column hole 101 are the same, the winding directions of the second windings 117 and 127 corresponding to the second column hole 102 are the same, and the winding direction of the first winding 116 or 126 is opposite to the winding direction of the second winding 117 or 127. For example, a current is inputted from the first winding 116 of the first layer 110 (an upward large arrow in FIG. 2A), the current sequentially runs through the second winding 117 of the first layer 110, the second conductive hole 107, the second winding 127 of the second layer 120, and the first winding 126 of the second layer 120 (the current is outputted from a downward large arrow in FIG. 2A). As can be seen from FIG. 2A (based on the viewing angle of FIG. 2A), the winding direction (clockwise) of the first winding 116 of the first layer 110 is the same as the winding direction (clockwise) of the first winding 126 of the second layer 120; and the winding direction (anticlockwise) of the second winding 117 of the first layer 110 is the same as the winding direction (anticlockwise) of the second winding 127 of the second layer 120. In this way, referring to FIG. 2C, FIG. 2C is a cross-sectional view of the winding layers in FIG. 2A and FIG. 2B applied to magnetic cores and magnetic columns of FIG. 1 at a position 2C-2C according to some embodiments. A current flows into the page from a left side of the first magnetic column 84, then flows out of the page between the first magnetic column 84 and the second magnetic column 86, and flows into the page from a right side of the second magnetic column 86. According to a design that winding directions corresponding to the same magnetic column 84 or 86 are the same and winding directions corresponding to different magnetic columns 84 and 86 are different, and after currents are inputted into two ends of the windings 116, 117, 126, and 127 that are connected in series, a closed magnetic circuit 88 is formed.

In addition, as can be seen from FIG. 2A, the first winding 116 and the second winding 117 of the first layer 110 are in a first line shape, and the first line shape is substantially presented as an S shape (or a reverse S shape). The first winding 126 and the second winding 127 of the second layer 120 form a second line shape. The second line shape and the first line shape substantially complement each other. The complementary line shapes herein do not require that two electrically connected and stacked windings form a circle, and the stacked windings may alternatively be an arc at a predetermined angle with an opening. The embodiment of FIG. 2A is used as an example, in the printed circuit board 100, if the first layer 110 and the second layer 120 are stacked (the first column hole 101 and the second column hole 102 are plated through holes), the first windings 116 and 126 of the stacked first layer 110 and second layer 120 are substantially a circle surrounding the first column hole 101, and the second windings 117 and 127 of the stacked first layer 110 and second layer 120 are substantially a circle surrounding the second column hole 102.

Figure 2B:
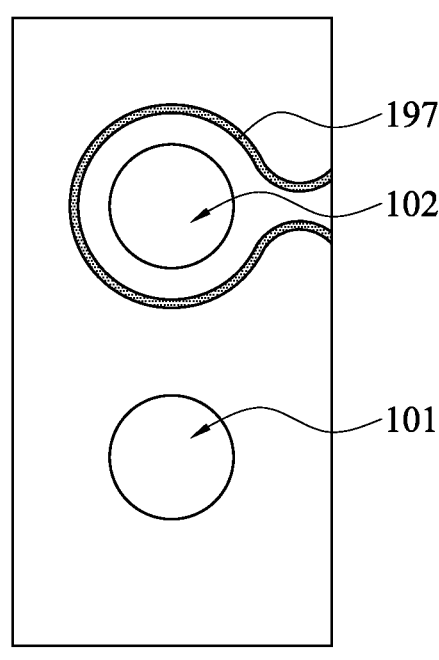
FIG. 2B is a top view of a winding layer according to some embodiments.
Figure 2C:
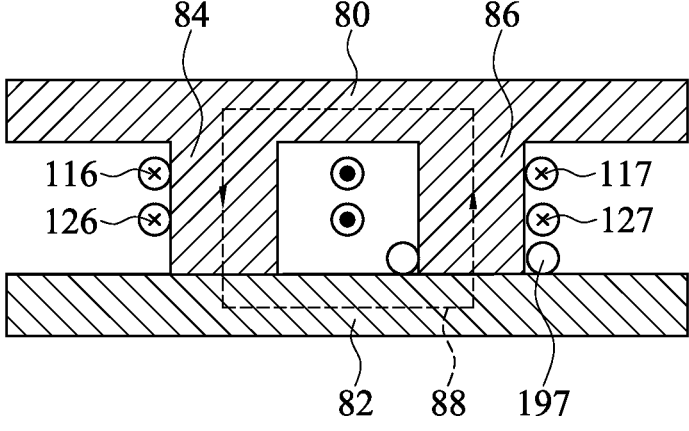
FIG. 2C is a cross-sectional view of the winding layers in FIG. 2A and FIG. 2B applied to magnetic cores and magnetic columns of FIG. 1 at a position 2C-2C according to some embodiments.
Figure 2D:
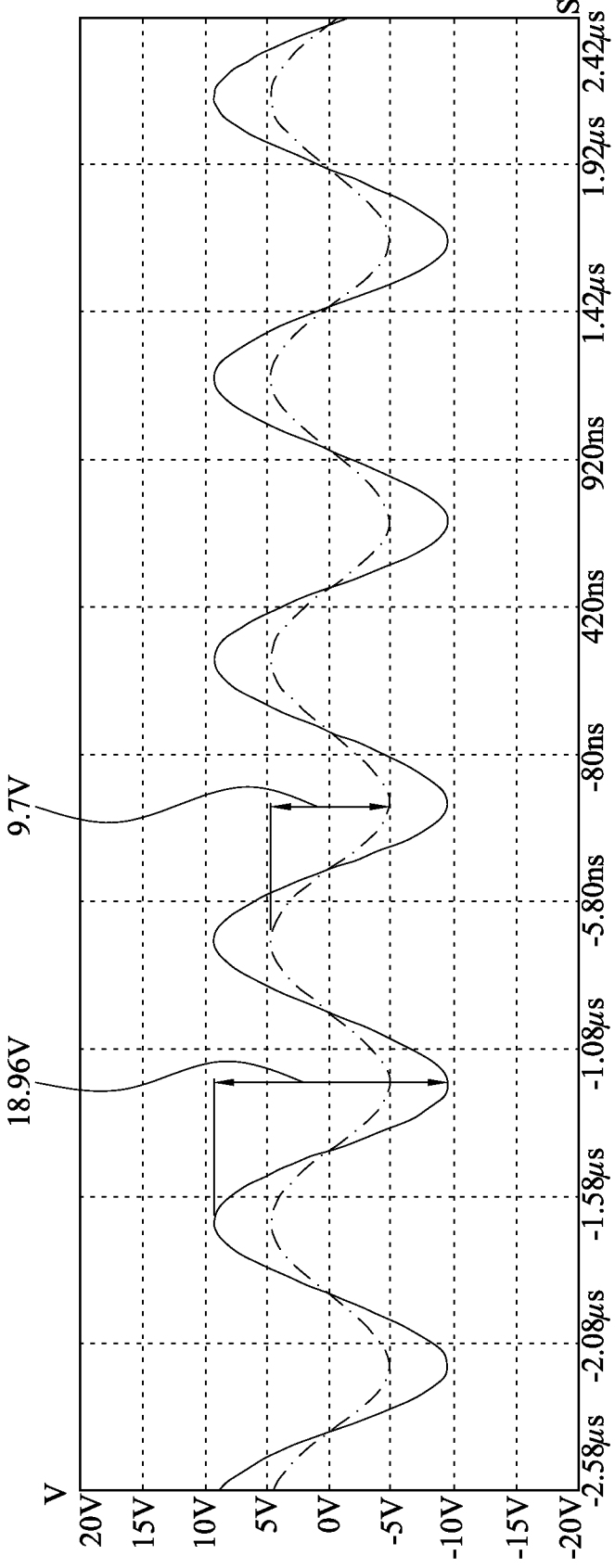
FIG. 2D is a diagram of experimental waves of a printed circuit board including the winding layers in FIG. 2A and FIG. 2B.

Referring to FIG. 2A, FIG. 2B, FIG. 2C, and FIG. 2D together, FIG. 2B is a top view of a winding layer according to some embodiments. FIG. 2D is a diagram of experimental waves of a printed circuit board including the winding layers in FIG. 2A and FIG. 2B. According to some embodiments, the planar transformer includes a first magnetic core 80, a second magnetic core 82, a first magnetic column 84, a second magnetic column 86, and a printed circuit board 100. Winding layers of the printed circuit board 100 include a first layer 110, a second layer 120, and an $N^{th}$ layer 190. As can be seen from FIG. 2B, the $N^{th}$ layer 190 includes a second winding 197, and the second winding 197 of the $N^{th}$ layer 190 surrounds the second column hole 102. The second winding 117 of the first layer 110 is electrically connected to the second winding 127 of the second layer 120 through the second conductive hole 107. Two ends of the windings 116, 117, 126, and 127 of the first layer 110 and the second layer 120 are used as an input end on a high voltage side respectively, and an alternating current represented by using a solid line in FIG. 2D is inputted into the input end. The second winding 197 of the $N^{th}$ layer 190 is used as a low voltage side and an output signal of the second winding 197 of the $N^{th}$ layer 190 is measured. Through experimental testing, the output signal is an alternating current represented by using a dot-and-dash line in FIG. 2D. In FIG. 2D, the horizontal axis is time and the unit is second (s), and the vertical axis is voltage and the unit is volt (V). As can be seen from FIG. 2D, a peak to peak voltage of an input signal is about 18.96 V, and a peak to peak voltage of the output signal is about 9.7 V. As can be learned from FIG. 2D, a turns ratio of the high voltage side to the low voltage side is about 2:1.

Figure 3A:
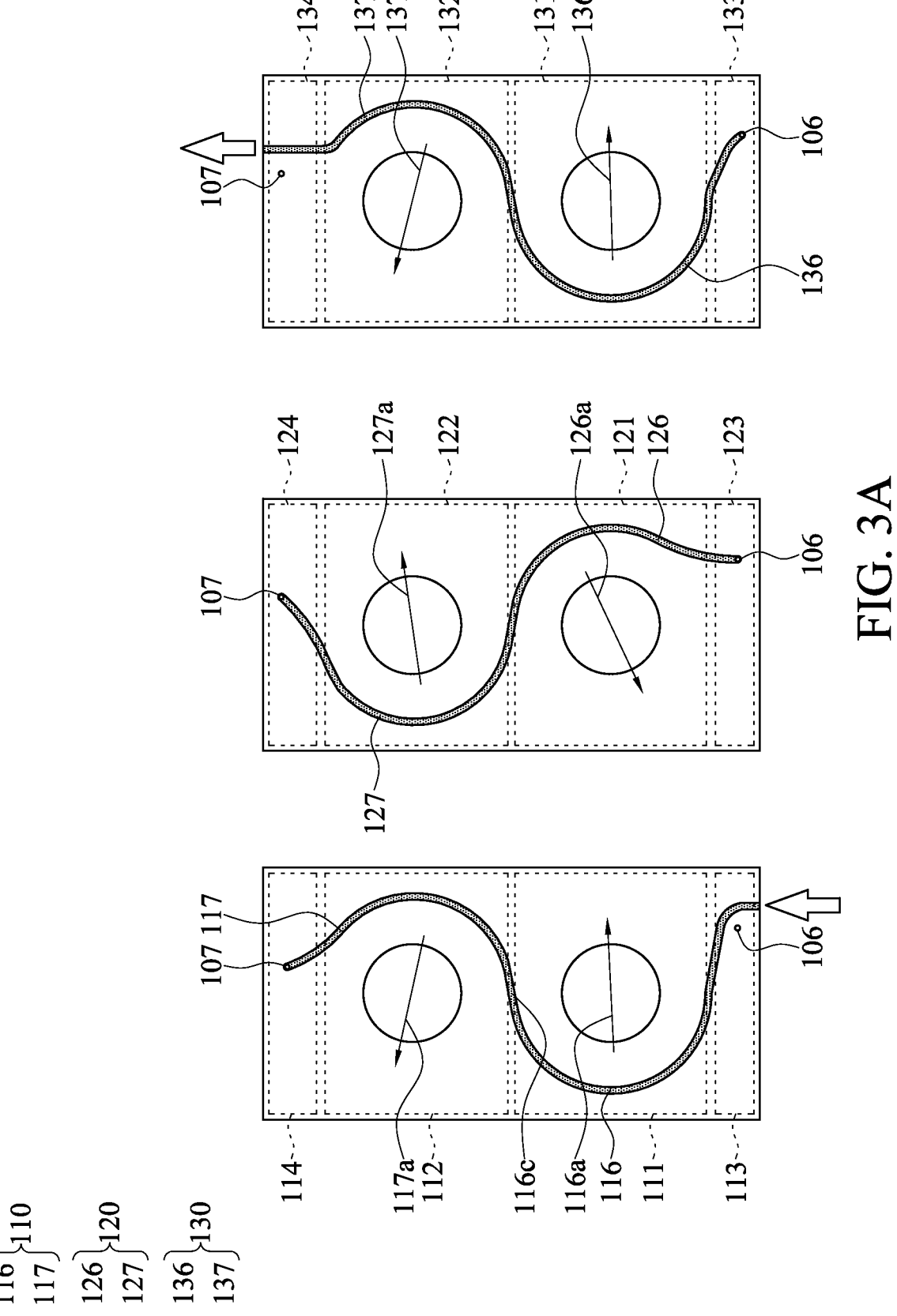
FIG. 3A is a top view of three winding layers according to some embodiments.

Referring to FIG. 3A, FIG. 3A is a top view of three winding layers according to some embodiments, and FIG. 3A presents the three winding layers stacked sequentially in a parallel manner. The winding layers of the printed circuit board 100 includes a first layer 110, a second layer 120, and a third layer 130 (or may be referred to as a third winding layer). The third layer 130 includes a first winding 136 and a second winding 137, where the first winding 136 of the third layer 130 is located in the first column winding region 131 of the third layer 130, surrounds the first column hole 101, and has a first opening direction 136*a*, the second winding 137 of the third layer 130 is located in the second column winding region 132 of the third layer 130, surrounds the second column hole 102, and has a second opening direction 137*a*, and the first winding 136 of the third layer 130 is electrically connected to the second winding 137 of the third layer 130. The first opening direction 136*a* of the third layer 130 is different from the second opening direction 137*a* of the third layer 130.

In the embodiment of FIG. 3A, the first winding 136 of the third layer 130 is located on the first side 101*a* of the first column hole 101, and the second winding 137 of the third layer 130 is located on the second side 102*b* of the second column hole 102.

In some embodiments, the printed circuit board 100 includes a first conductive hole 106 and a second conductive hole 107, the first conductive hole 106 passes through the first extending regions 113, 123, and 133, the second conductive hole 107 passes through the second extending regions 114, 124, and 134, the first winding 116 of the first layer 110 extends to the first extending region 113 of the first layer 110, the second winding 117 of the first layer 110 and the second winding 127 of the second layer 120 are electrically connected through the second conductive hole 107, the first winding 126 of the second layer 120 and the first winding 136 of the third layer 130 are electrically connected through the first conductive hole 106, and the second winding 137 of the third layer 130 extends to the second extending region 134 of the third layer 130. Therefore, the first winding 116 of the first layer 110, the second winding 117 of the first layer 110, the second winding 127 of the second layer 120, the first winding 126 of the second layer 120, the first winding 136 of the third layer 130, and the second winding 137 of the third layer 130 of the printed circuit board 100 are sequentially connected in series.

In some embodiments, referring to FIG. 3A, the first winding 126 of the second layer 120 extends to the first extending region 123 of the second layer 120 to be electrically connected to the first conductive hole 106, and the first winding 136 of the third layer 130 extends to the first extending region 133 of the third layer 130 to be electrically connected to the first conductive hole 106. The second winding 137 of the third layer 130 extends to the second extending region 134 of the third layer 130 to be electrically connected to an electronic component. In this embodiment, the conductive holes 106 and 107 are plated through holes and are merely located in the extending regions 113, 114, 123, 124, 133, and 134, and there is no conductive hole in the column winding regions 111, 112, 121, 122, 131, and 132.

Figure 3B:
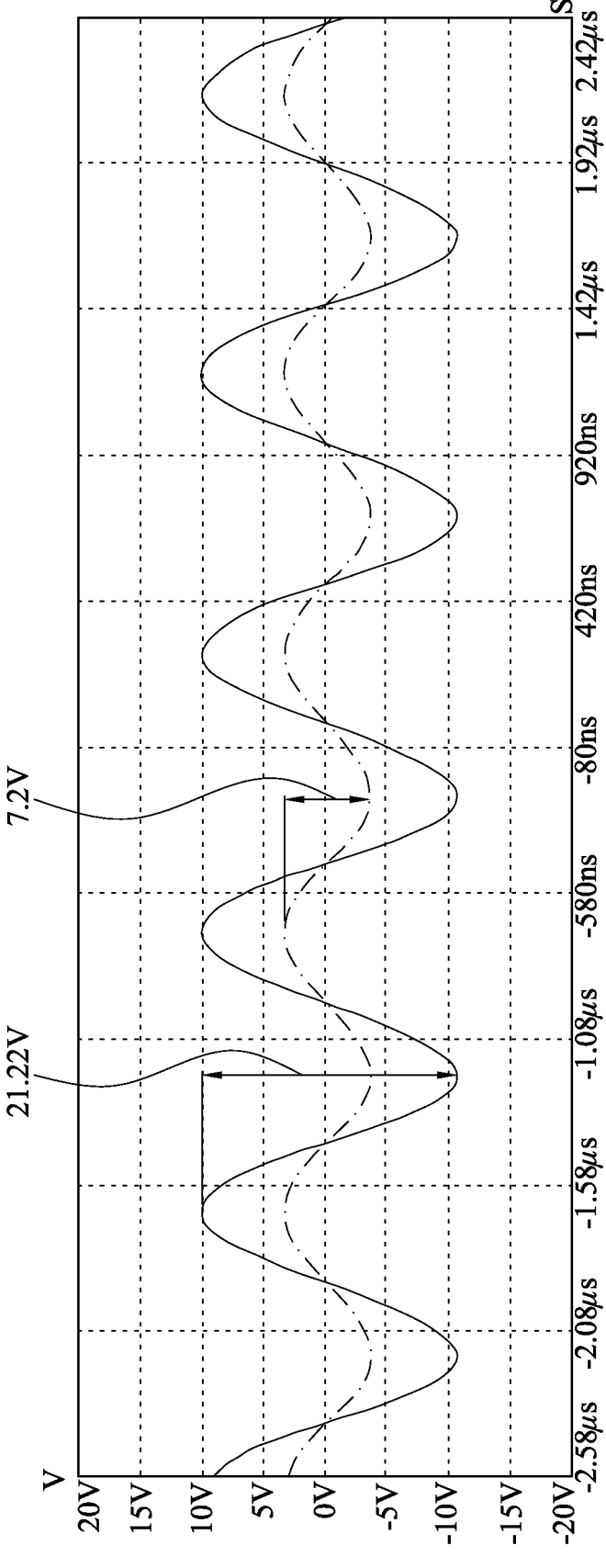
FIG. 3B is a diagram of experimental waves of a printed circuit board including the winding layers in FIG. 3A and FIG. 2B.

Referring to FIG. 3B, FIG. 3B is a diagram of experimental waves of a printed circuit board including the winding layers in FIG. 3A and FIG. 2B. The winding layers of the printed circuit board 100 include a first layer 110, a second layer 120, a third layer 130, and an $N^{th}$ layer 190. Two ends of the windings 116, 117, 126, 127, 136, and 137 that are connected in series of the first layer 110, the second layer 120, and the third layer 130 are used as an input end on a high voltage side respectively, and an alternating current represented by using a solid line in FIG. 3B is inputted into the input end. The second winding 197 of the $N^{th}$ layer 190 is used as a low voltage side and an output signal of the second winding 197 of the $N^{th}$ layer 190 is measured. Through experimental testing, the output signal is an alternating current represented by using a dot-and-dash line in FIG. 3B. As can be seen from FIG. 3B, a peak to peak voltage of an input signal is about 21.22 V, and a peak to peak voltage of the output signal is about 7.2 V. As can be learned from FIG. 3B, a turns ratio of the high voltage side to the low voltage side is about 3:1. In some embodiments, the printed circuit board 100 includes four or more winding layers, such as an embodiment of FIG. 7 or FIG. 10.

Each conductive hole 106 or 107 is electrically connected to windings located on different layers and connected to the conductive hole, and each conductive hole 106 or 107 may be a plated through hole, a blind via hole, or a buried via hole. For example, the second conductive hole 107 in FIG. 2A and FIG. 3A is a plated through hole, and during implementation, the second conductive hole 107 may be a blind via hole. When the conductive holes 106 and 107 are plated through holes, the conductive holes may have a relatively easy manufacturing process, a high yield rate, and lower costs. The conductive holes 106 and 107 are located in the extending regions 113, 114, 123, 124, 133, and 134, and the column winding regions 111, 112, 121, 122, 131, and 132 of the printed circuit board 100 are merely provided with windings 116, 117, 126, 127, 136, and 137 without any plated through hole, blind via hole, or buried via hole, so that it is more convenient for winding design, and the yield rate is improved.

Figure 4A:
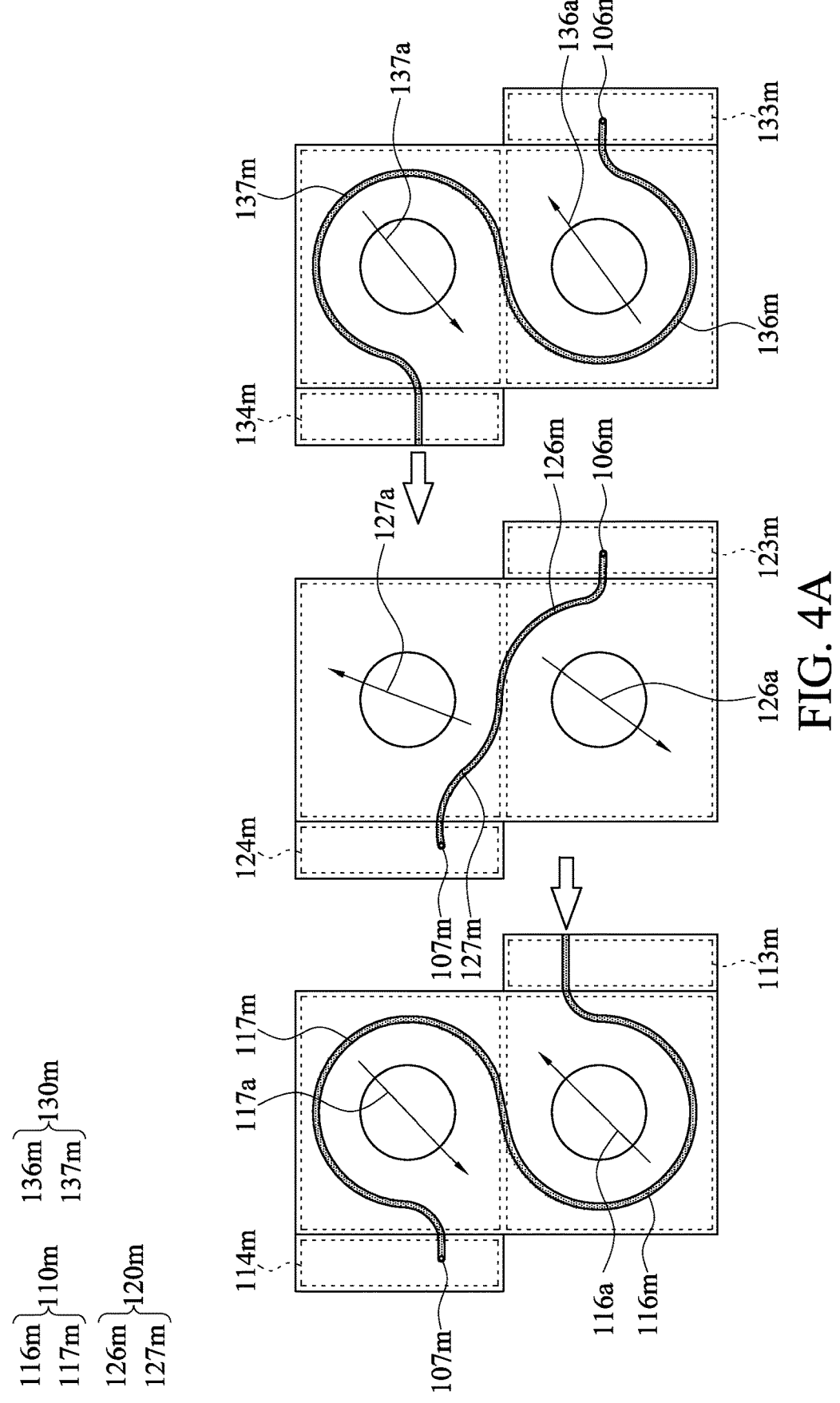
FIG. 4A is a top view of three winding layers according to some embodiments.

Referring to FIG. 4A, FIG. 4A is a top view of three winding layers according to some embodiments, and FIG. 4A presents the three winding layers stacked sequentially in a parallel manner. The winding layers of FIG. 4A include a first layer 110*m*, a second layer 120*m*, and a third layer 130*m*. A first winding 116*m* of the first layer 110*m* is electrically connected to a second winding 117*m* of the first layer 110*m*. A first opening direction 116*a* of the first winding 116*m* of the first layer 110*m* faces toward an upper right of a viewing angle of FIG. 4A, a second opening direction 117*a* of the second winding 117*m* of the first layer 110*m* faces toward a lower left of the viewing angle of FIG. 4A, and the two opening directions are different.

A first winding 126*m* of the second layer 120*m* is electrically connected to a second winding 127*m* of the second layer 120*m*. A first opening direction 126*a* of the first winding 126*m* of the second layer 120*m* faces toward the lower left of the viewing angle of FIG. 4A, a second opening direction 127*a* of the second winding 127*m* of the second layer 120*m* faces toward the upper right of the viewing angle of FIG. 4A, and the two opening directions are different.

A first winding 136*m* of the third layer 130*m* is electrically connected to a second winding 137*m* of the third layer 130*m*. A first opening direction 136*a* of the first winding 136*m* of the third layer 130*m* faces toward the upper right of the viewing angle of FIG. 4A, a second opening direction 137*a* of the second winding 137*m* of the third layer 130*m* faces toward the lower left of the viewing angle of FIG. 4A, and the two opening directions are different.

Still referring to FIG. 4A, in some embodiments, first extending regions 113$m$, 123$m$, and 133$m$ and second extending regions 114$m$, 124$m$, and 134$m$ are respectively located on two opposite sides of a connecting line between a center of a circle of the first column hole 101 and a center of a circle of the second column hole 102 (left and right sides of a connecting line between centers of a circle of column holes at the viewing angle of FIG. 4A). The first extending regions 113$m$, 123$m$, and 133$m$ correspond to the first column hole 101, and the second extending regions 114$m$, 124$m$, and 134$m$ correspond to the second column hole 102. The first conductive hole 106$m$ passes through the first extending regions 113$m$, 123$m$, and 133$m$, and the second conductive hole 107$m$ passes through the second extending regions 114$m$, 124$m$, and 134$m$. The first winding 116$m$ of the first layer 110$m$ extends to the first extending region 113$m$ of the first layer 110$m$, the second winding 117$m$ of the first layer 110$m$ and the second winding 127$m$ of the second layer 120$m$ are electrically connected through the second conductive hole 107$m$, the first winding 126$m$ of the second layer 120$m$ and the first winding 136$m$ of the third layer 130$m$ are electrically connected through the first conductive hole 106$m$, and the second winding 137$m$ of the third layer 130$m$ extends to the second extending region 134$m$ of the third layer 130$m$. Therefore, the first winding 116$m$ of the first layer 110$m$, the second winding 117$m$ of the first layer 110$m$, the second winding 127$m$ of the second layer 120$m$, the first winding 126$m$ of the second layer 120$m$, the first winding 136$m$ of the third layer 130$m$, and the second winding 137$m$ of the third layer 130$m$ are sequentially connected in series. In this embodiment, the first conductive hole 106$m$ is a blind via hole and is merely located in the first extending region 123$m$ of the second layer 120$m$ and the first extending region 133$m$ of the third layer 130$m$, and the second conductive hole 107$m$ is a blind via hole and is merely located in the second extending region 114$m$ of the first layer 110$m$ and the second extending region 124$m$ of the second layer 120$m$.

Figure 4B:
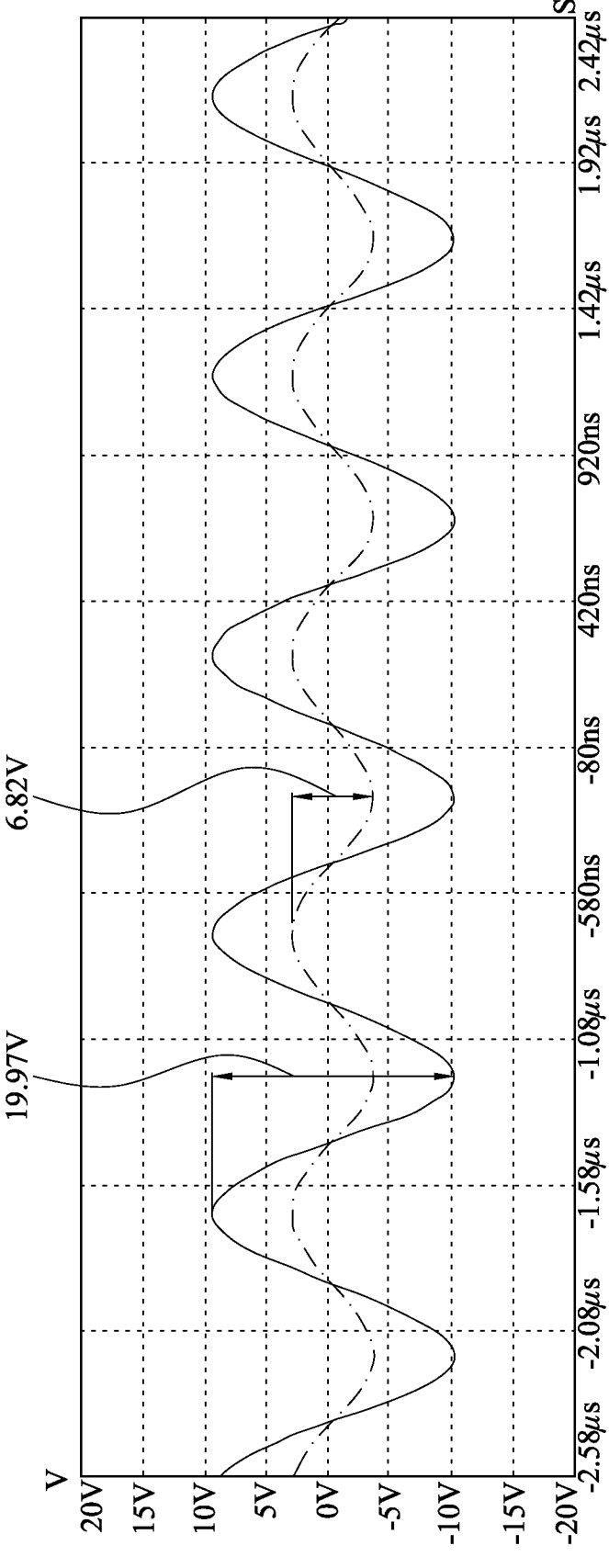
FIG. 4B is a diagram of experimental waves of a printed circuit board including the winding layers in FIG. 4A and FIG. 2B.

Referring to FIG. 4B, FIG. 4B is a diagram of experimental waves of a printed circuit board including the winding layers in FIG. 4A and FIG. 2B. The winding layers of the printed circuit board 100 include the first layer 110$m$, the second layer 120$m$, the third layer 130$m$, and an N$^{th}$ layer 190. Two ends of the windings 116$m$, 117$m$, 126$m$, 127$m$, 136$m$, and 137$m$ that are connected in series of the first layer 110$m$, the second layer 120$m$, and the third layer 130$m$ are used as an input end on a high voltage side respectively, and an alternating current represented by using a solid line in FIG. 4B is inputted into the input end. The second winding 197 of the N$^{th}$ layer 190 is used as a low voltage side and an output signal of the second winding 197 of the N$^{th}$ layer 190 is measured. Through experimental testing, the output signal is an alternating current represented by using a dot-and-dash line in FIG. 4B. As can be seen from FIG. 4B, a peak to peak voltage of an input signal is about 19.97 V, and a peak to peak voltage of the output signal is about 6.82 V. As can be learned from FIG. 4B, a turns ratio of the high voltage side to the low voltage side is about 3:1.

Total arc lengths (or total arc angles) of surrounding arcs of the windings connected in series in FIG. 3A and FIG. 4A are compared, and the total arc length (or total arc angle) of the surrounding arcs of the windings connected in series in FIG. 4A is greater than the total arc length (or total arc angle) of the surrounding arcs of the windings connected in series in FIG. 3A. Then, the windings connected in series in FIG.

3A and FIG. 4A are respectively used as high voltage side windings, and the second winding 197 in FIG. 2B is used as a corresponding low voltage side winding. Through experiments, turns ratios of the high voltage side to the low voltage side among the three parties are both about 3:1. Apparently, the turns ratio is highly correlated to a winding passing through the foregoing closed magnetic circuit 88 (referring to FIG. 2C), and approximately has nothing to do with a total arc length (or total arc angle) of surrounding arcs not passing through the closed magnetic circuit 88. Through these experiments, a user may design positions of the extending regions flexibly, to match with electronic components of the planar transformer and an electrical connection manner. For example, the first extending region 113 is selectively designed on the left side, the lower side (as shown in FIG. 2A), or the right side (as shown in FIG. 4A) of the first column winding region 111, and the second extending region 114 is selectively designed on the left side (as shown in FIG. 4A), the upper side (as shown in FIG. 2A), or the right side of the second column winding region 112. In some embodiments, the extending regions are provided with conductive holes or wires. The conductive holes or wires are electrically connected to a high voltage side circuit, a low voltage side circuit, and circuit layout. Therefore, flexible position configuration of the extending regions makes circuit design more convenient.

Figure 5A:
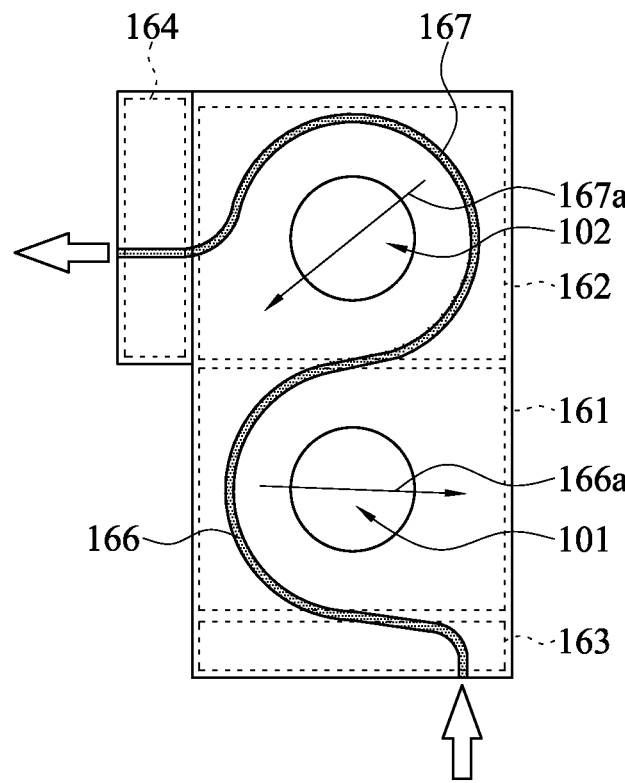
FIG. 5A is a top view of a winding layer according to some embodiments.

Referring to FIG. 5A, FIG. 5A is a top view of a winding layer according to some embodiments. The winding layer 160 of FIG. 5A includes a first winding 166 and a second winding 167, and the first winding 166 surrounds the first column hole 101 and has a first opening direction 166$a$. The second winding 167 surrounds the second column hole 102 and has a second opening direction 167$a$, and the first opening direction 166$a$ is different from the second opening direction 167$a$. The first winding 166 is electrically connected to the second winding 167. In some embodiments, the first extending region 163, the first column winding region 161, the second column winding region 162, and the second extending region 164 are sequentially adjacent to each other. The first extending region 163 is located on a connecting line between the first column hole 101 and the second column hole 102 (for example, a connecting line between centers of a circle of the two column holes), and the second extending region 164 is not located on the connecting line. In this embodiment (at a viewing angle of FIG. 5A), the first extending region 163 is located on the lower side of the first column hole 101, and the second extending region 164 is located on the left side of the second column hole 102.

Figure 5B:
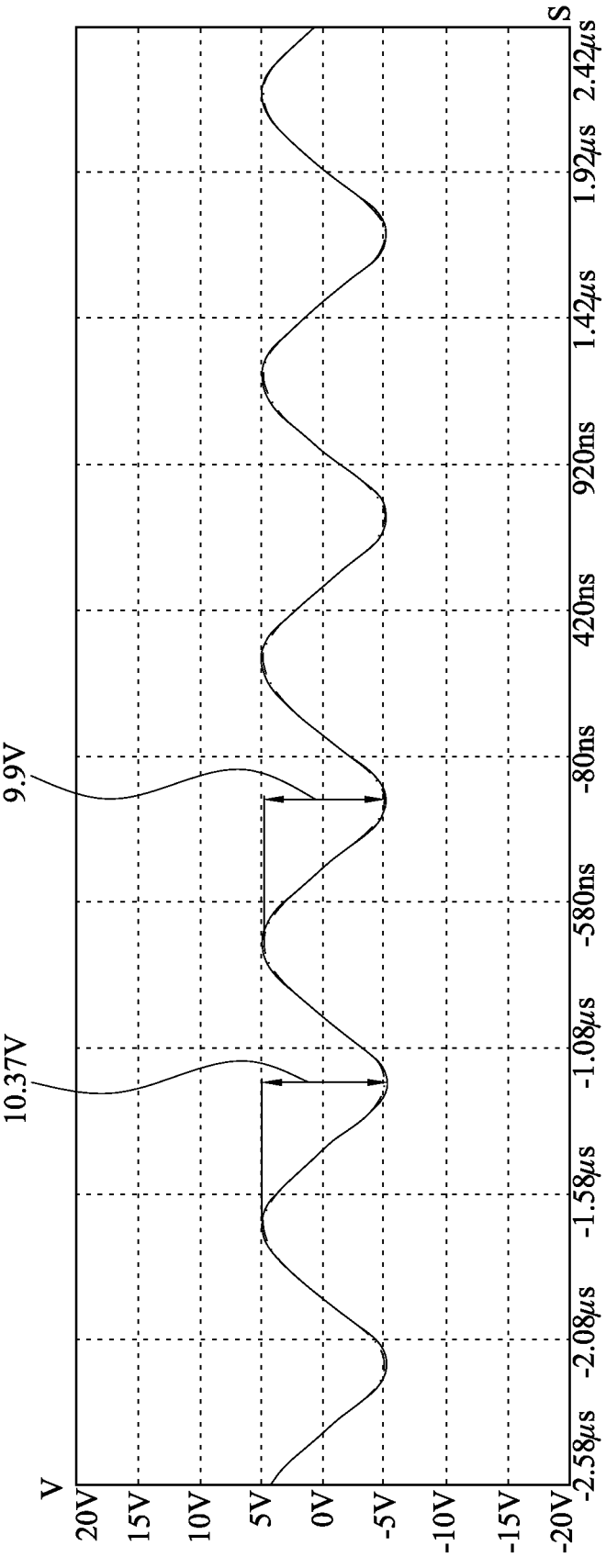
FIG. 5B is a diagram of experimental waves of a printed circuit board including the winding layers in FIG. 5A and FIG. 2B.

Referring to FIG. 5B, FIG. 5B is a diagram of experimental waves of a printed circuit board including the winding layers in FIG. 5A and FIG. 2B. The winding layers of the printed circuit board 100 include the first layer 110 and an N$^{th}$ layer 190. Two ends of the windings 116 and 117 that are connected in series of the first layer 110 are used as an input end on a high voltage side respectively, and an alternating current represented by using a solid line in FIG. 5B is inputted into the input end. The second winding 197 of the N$^{th}$ layer 190 is used as a low voltage side and an output signal of the second winding 197 of the N$^{th}$ layer 190 is measured. Through experimental testing, the output signal is an alternating current represented by using a dot-and-dash line in FIG. 5B. As can be seen from FIG. 5B, a peak to peak voltage of an input signal is about 10.37 V, and a peak to peak voltage of the output signal is about 9.9 V. As can be learned from FIG. 5B, a turns ratio of the high voltage side to the low voltage side is about 1:1. As can be seen from FIG. 5A, a total arc length of surrounding arcs of the first winding 166 and the second winding 167 of FIG. 5A is greater than one turn, and an experiment result is that the turns ratio is about 1:1. The experiment result proves that the turns ratio is highly correlated to a winding passing through the closed magnetic circuit 88 (referring to FIG. 2C). According to some embodiments, the winding layers of the printed circuit board additionally include a turning region (not shown in the figure), and the turning region is located between the first column winding region and the second column winding region. A winding layer includes a first winding, a connection segment (not shown in the figure), and a second winding that are connected sequentially. This embodiment may be applied to a case that a distance between the first column hole 101 and the second column hole 102 is relatively great.

Figure 6:
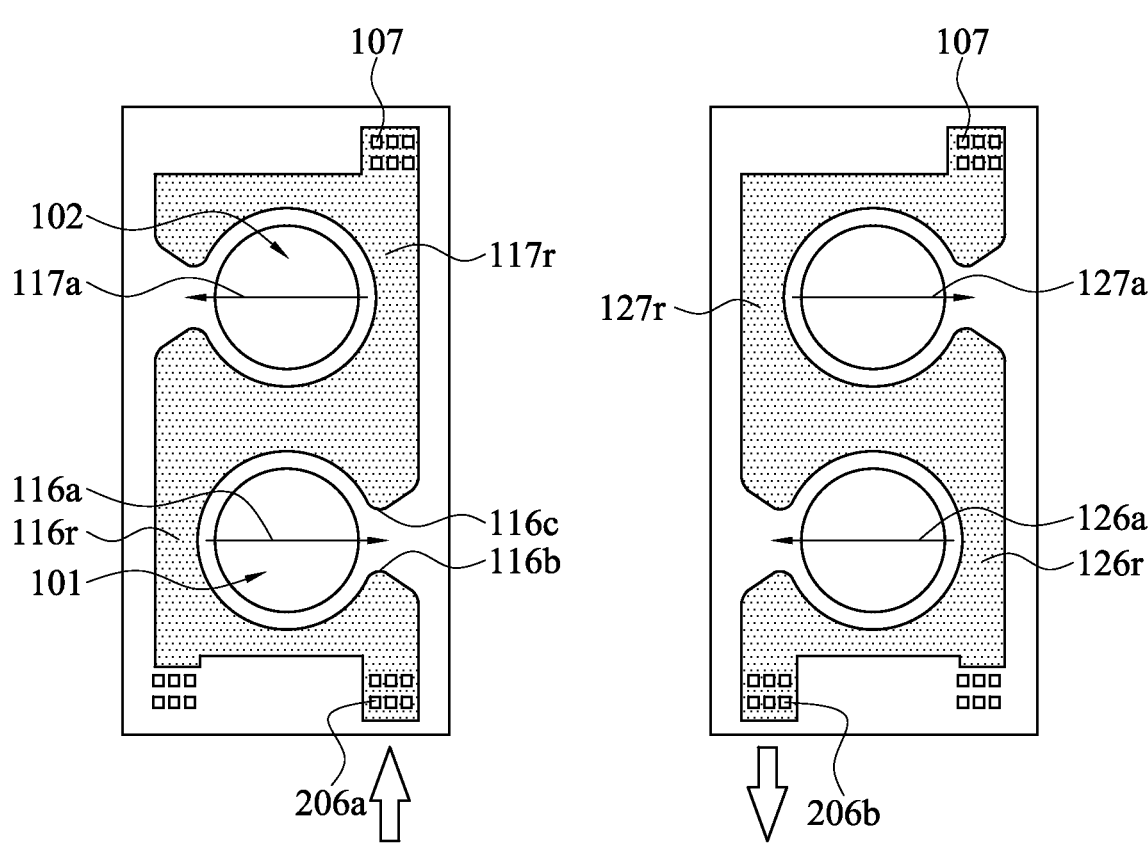
FIG. 6 is a top view of two winding layers according to some embodiments.

In the foregoing embodiments, the winding is a linear conductor such as linear copper foil. However, the winding is not limited thereto, and the winding may be alternatively a sheet conductor such as sheet copper foil. Referring to FIG. 6, FIG. 6 is a top view of two winding layers according to some embodiments. FIG. 6 presents the two vertically stacked winding layers in a parallel manner, and FIG. 6 draws windings such as sheet copper foil in a dotted profile line manner. The winding layers of FIG. 6 include a first layer 110r and a second layer 120r. A first winding 116r of the first layer 110r surrounds the first column hole 101 and has a first opening direction 116a, and a second winding 117r of the first layer 110r surrounds the second column hole 102 and has a second opening direction 117a. As described above, a surrounding arc formed by the first winding 116r has two endpoints 116b and 116c (that is, endpoints of an opening of the surrounding arc). A connecting line between the two endpoints 116b and 116c is a chord of the first winding 116r. The first opening direction 116a of the first winding 116r is a direction that is perpendicular to the chord of the first winding 116r, and faces outward. The first opening direction 116a of the first winding 116r faces toward the right side of a viewing angle of FIG. 6. Similarly, the second opening direction 117a of the second winding 117r of the first layer 110r faces toward the left side of the viewing angle of FIG. 6, and is different from the first opening direction 116a of the first winding 116r of the first layer 110r.

A first winding 126r of the second layer 120r surrounds the first column hole 101 and has a first opening direction 126a, and a second winding 127r of the second layer 120r surrounds the second column hole 102 and has a second opening direction 127a. The first opening direction 126a of the first winding 126r of the second layer 120r faces toward the left side of the viewing angle of FIG. 6. Similarly, the second opening direction 127a of the second winding 127r of the second layer 120r faces toward the right side of the viewing angle of FIG. 6, and is different from the first opening direction 126a of the first winding 126r of the second layer 120r.

The second winding 117r of the first layer 110r is electrically connected to the second winding 127r of the second layer 120r through a conductive hole 107. Therefore, in the embodiment of FIG. 6, the first winding 116r of the first layer 110r, the second winding 117r of the first layer 110r, the second winding 127r of the second layer 120r, and the first winding 126r of the second layer 120r are sequentially connected in series. In some embodiments, the conductive hole 107 used for electrically connecting the second winding 117r of the first layer 110r and the second winding 127r of the second layer 120r is a single hole (for example, a single conductive hole shown in FIG. 2A) or a plurality of holes (for example, two rows of conductive holes shown in FIG. 6).

In the embodiment of FIG. 6, winding directions of the first windings 116r and 126r corresponding to the first column hole 101 are the same, winding directions of the second windings 117r and 127r corresponding to the second column hole 102 are the same, and the winding direction of the first winding 116r or 126r is opposite to the winding direction of the second winding 117r or 127r. As described above, a current is inputted from the first winding 116r of the first layer 110r and the current is outputted from the first winding 126r of the second layer 120r after passing through the second conductive hole 107 (referring to a large arrow shown in the bottom of FIG. 6). The winding directions of the first winding 116r of the first layer 110r and the first winding 126r of the second layer 120r are clockwise (based on the viewing angle of FIG. 6), and the winding directions of the second winding 117r of the first layer 110r and the second winding 127r of the second layer 120r are anticlockwise (based on the viewing angle of FIG. 6).

Referring to FIG. 7, FIG. 7 is a three-dimensional exploded view of a planar transformer according to some embodiments. The planar transformer includes a first magnetic core 80, a second magnetic core 82, two first sub-magnetic columns 84a and 84b, two second sub-magnetic columns 86a and 86b, and a printed circuit board 200. The printed circuit board 200 is a four-layer board and includes a first column hole 201 and a second column hole 202. The first sub-magnetic columns 84a and 84b are located in the first column hole 201, and the second sub-magnetic columns 86a and 86b are located in the second column hole 202. The printed circuit board 200, the first sub-magnetic columns 84a and 84b, and the second sub-magnetic columns 86a and 86b are located between the first magnetic core 80 and the second magnetic core 82. The printed circuit board 200 includes a plurality of winding layers 210, 220, 230, and 240. In this embodiment, the four-layer board includes three insulating layers, which are respectively a first insulating layer 291, a second insulating layer 292, and a third insulating layer 293. The printed circuit board 200 includes four winding layers, which are respectively a first layer 210, a second layer 220, a third layer 230, and a fourth layer 240. The first insulating layer 291 is located between the first layer 210 and the second layer 220, the second insulating layer 292 is located between the second layer 220 and the third layer 230, and the third insulating layer 293 is located between the third layer 230 and the fourth layer 240. Therefore, the first layer 210 and the second layer 220 are respectively located on an upper surface and a lower surface of the first insulating layer 291, and the third layer 230 and the fourth layer 240 are respectively located on an upper surface and a lower surface of the third insulating layer 293.

Figure 8:
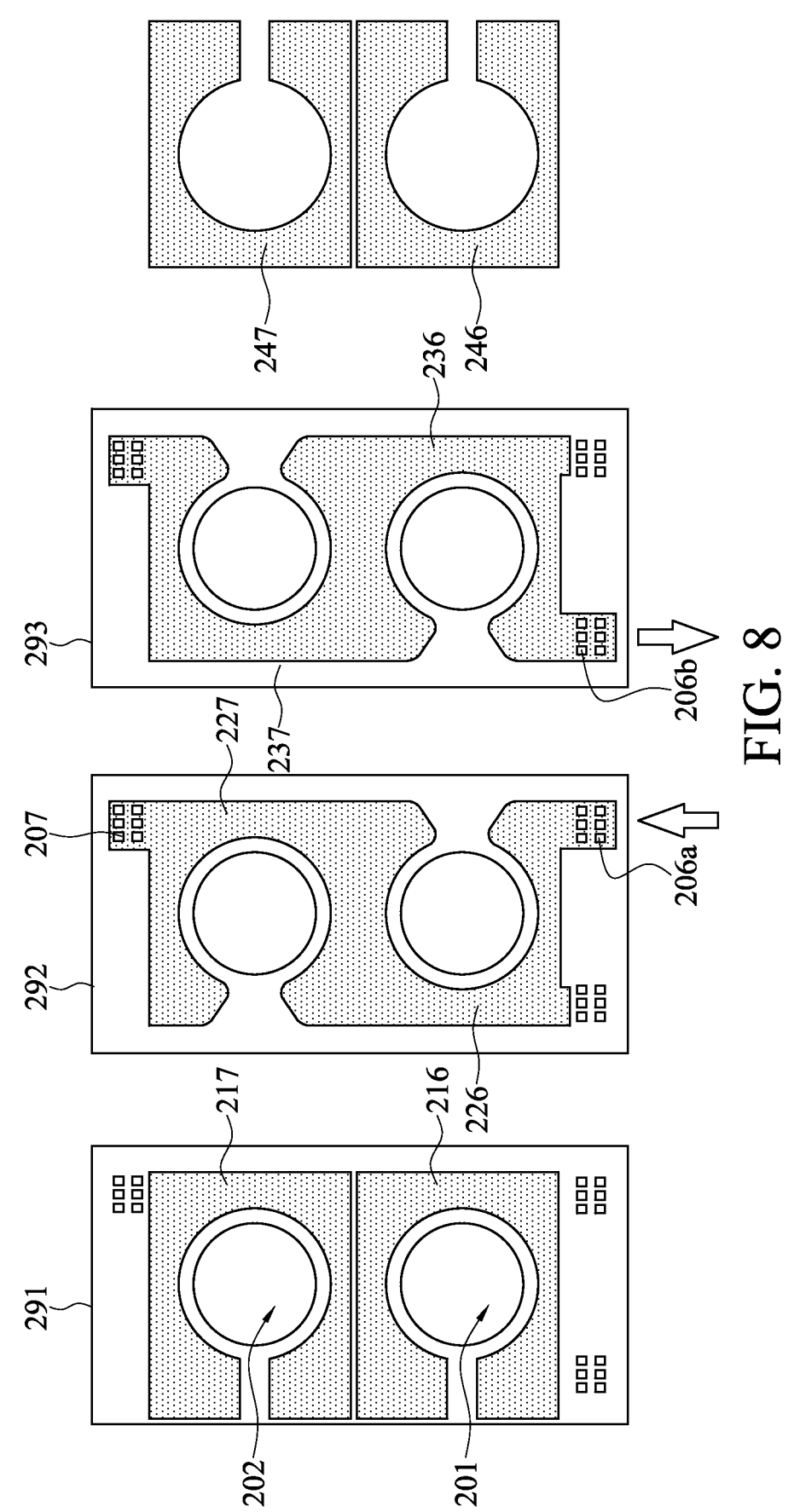
FIG. 8 is a schematic top view of winding layers of a printed circuit board in the embodiment of FIG. 7.

Referring to FIG. 7 and FIG. 8 together, FIG. 8 is a schematic top view of the winding layers of the printed circuit board in the embodiment of FIG. 7, and FIG. 8 presents the vertically stacked four winding layers in a parallel manner (from a top view of FIG. 7). In the embodiment of FIG. 8, the third layer 230 is located on the upper surface of the third insulating layer 293, and the fourth layer 240 is located on the lower surface of the third insulating layer 293. To present the fourth layer 240 better, only the third layer 230 is drawn on the third insulating layer 293 in FIG. 8, and the fourth layer is separately presented in a top view for description together. A first winding 226 of the second layer 220 is electrically connected to a second winding 227 of the second layer 220. A first winding 236 of the third layer 230 is electrically connected to a second winding 237 of the third layer 230. The second winding 227 of the second layer 220 and the second winding 237 of the third layer 230 are electrically connected through a second conductive hole 207. Therefore, the first winding 226 of the second layer 220, the second winding 227 of the second layer 220, the second winding 237 of the third layer 230, and the first winding 236 of the third layer 230 are sequentially connected in series. In some embodiments, first conductive holes 206a and 206b and the second conductive hole 207 are plated through holes. The first windings 226 and 236 of the second layer 220 and the third layer 230 are electrically connected to the first conductive holes 206a and 206b respectively, and based on this, two endpoints of the first windings 226 and 236 and the second windings 227 and 237 that are connected in series of the second layer 220 and the third layer 230 are electrically connected to a surface of the printed circuit board 200.

A first winding 216 and a second winding 217 of the first layer 210 respectively surround the first column hole 201 and the second column hole 202. The first winding 216 of the first layer 210 is not electrically connected to the second winding 217 of the first layer 210. Therefore, quantities of winding turns of the first winding 216 of the first layer 210 and the second winding 217 of the first layer 210 are substantially one respectively (with a relatively small opening). A first winding 246 and a second winding 247 of the fourth layer 240 respectively surround the first column hole 201 and the second column hole 202. The first winding 246 of the fourth layer 240 is not electrically connected to the second winding 247 of the fourth layer 240. Therefore, quantities of winding turns of the first winding 246 of the fourth layer 240 and the second winding 247 of the fourth layer 240 are substantially one respectively (with a relatively small opening). The coils 226, 227, 236, and 237 of the second layer 220 and the third layer 230 are high voltage side coils $T_H$ (referring to FIG. 9), and the coils 216, 217, 246, and 247 of the first layer 210 and the fourth layer 240 are low voltage side coils $T_L$. Therefore, a turns ratio of the high voltage side coils $T_H$ to the low voltage side coils $T_L$ is 2:1:1:1:1.

Figure 9:
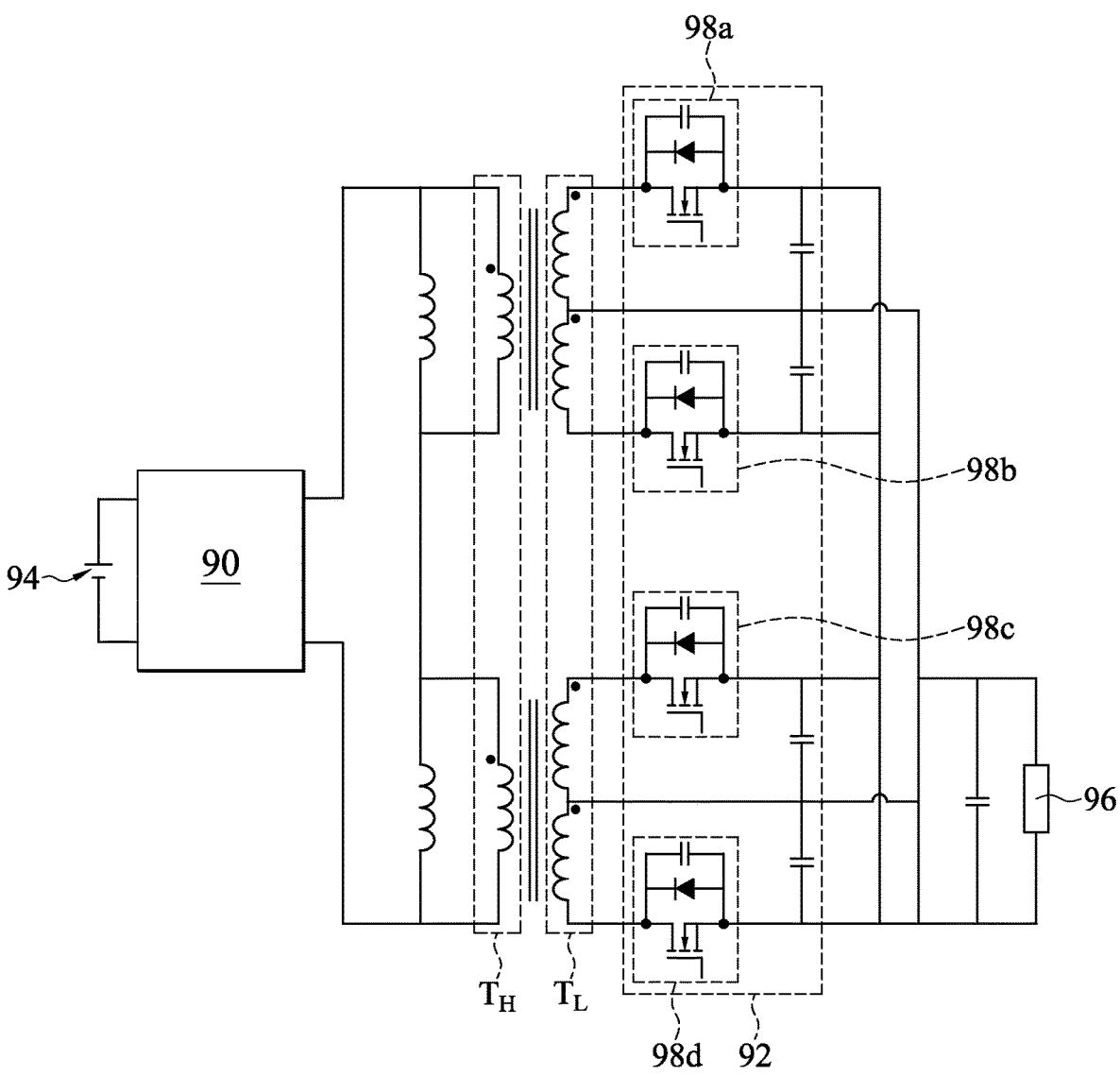
FIG. 9 is a circuit functional block diagram of the planar transformer in the embodiment of FIG. 7.

Referring to FIG. 7 and FIG. 9 together, FIG. 9 is a circuit functional block diagram of the planar transformer in the embodiment of FIG. 7. The planar transformer additionally includes a high voltage side circuit 90 and a low voltage side circuit 92. The high voltage side circuit 90 is adapted to connect to an input power supply 94, and the input power supply 94 may be a direct current power supply (as shown in FIG. 9) or an alternating current power supply. The high voltage side circuit 90 is adapted to convert the input power supply 94 into a predetermined alternating current and then inputs the alternating current into the high voltage side coils $T_H$. After the high voltage side coils $T_H$ receive the alternating current, an induced current is generated at the low voltage side coils $T_L$. The low voltage side circuit 92 rectifies the induced current and then outputs the induced current to a load 96. The low voltage side circuit 92 includes synchronous rectification circuits 98a, 98b, 98c, and 98d (that is, the foregoing electronic components), and the synchronous rectification circuits 98a, 98b, 98c, and 98d are electrically connected to the corresponding first winding 216 of the first layer 210, the second winding 217 of the first layer 210, the first winding 246 of the fourth layer 240, and the second winding 247 of the fourth layer 240 respectively.

In some embodiments, referring to FIG. 7 and FIG. 8 together, the first winding 216 and the second winding 217 of the first layer 210 are located on the upper surface of the first insulating layer 291, and are electrically connected to the corresponding synchronous rectification circuits 98a and 98b respectively. The first winding 246 and the second winding 247 of the fourth layer 240 are located on the lower surface of the third insulating layer 293, and are electrically connected to the corresponding synchronous rectification circuits 98c and 98d respectively. An electrical connection relationship in FIG. 9 is formed through the foregoing electrical connections.

In the embodiment of FIG. 7, the two synchronous rectification circuits 98c and 98d corresponding to the fourth layer 240 and the two synchronous rectification circuits 98a and 98b corresponding to the first layer 210 are located on two opposite sides of the printed circuit board 200, and the embodiments are not limited thereto. In some embodiments, the two synchronous rectification circuits 98c and 98d and the other two synchronous rectification circuits 98a and 98b are located on the same side of the printed circuit board 200 (that is, a left long side of the printed circuit board 200 in FIG. 7). In this embodiment, opening directions of the first winding 246 and the second winding 247 of the fourth layer 240 and opening directions of the first winding 216 and the second winding 217 of the first layer 210 are the same (facing toward an upper left side of FIG. 7).

Referring to FIG. 7 and FIG. 8 together again, when a current flows in from the first winding 226 of the second layer 220, runs through the second winding 227 of the second layer 220 and the second winding 237 of the third layer 230, and flows out from the first winding 236 of the third layer 230, a magnetic flux (that is, the foregoing closed magnetic circuit 88, referring to FIG. 2C) is generated on the first magnetic core 80, the first sub-magnetic columns 84a and 84b, the second magnetic core 82, and the two second sub-magnetic columns 86a and 86b, so that the first winding 216 of the first layer 210, the second winding 217 of the first layer 210, the first winding 246 of the fourth layer 240, and the second winding 247 of the fourth layer 240 generate induced currents, and the currents are outputted to the load 96 after being synchronously rectified by the corresponding synchronous rectification circuits 98a, 98b, 98c, and 98d.

Figure 10:
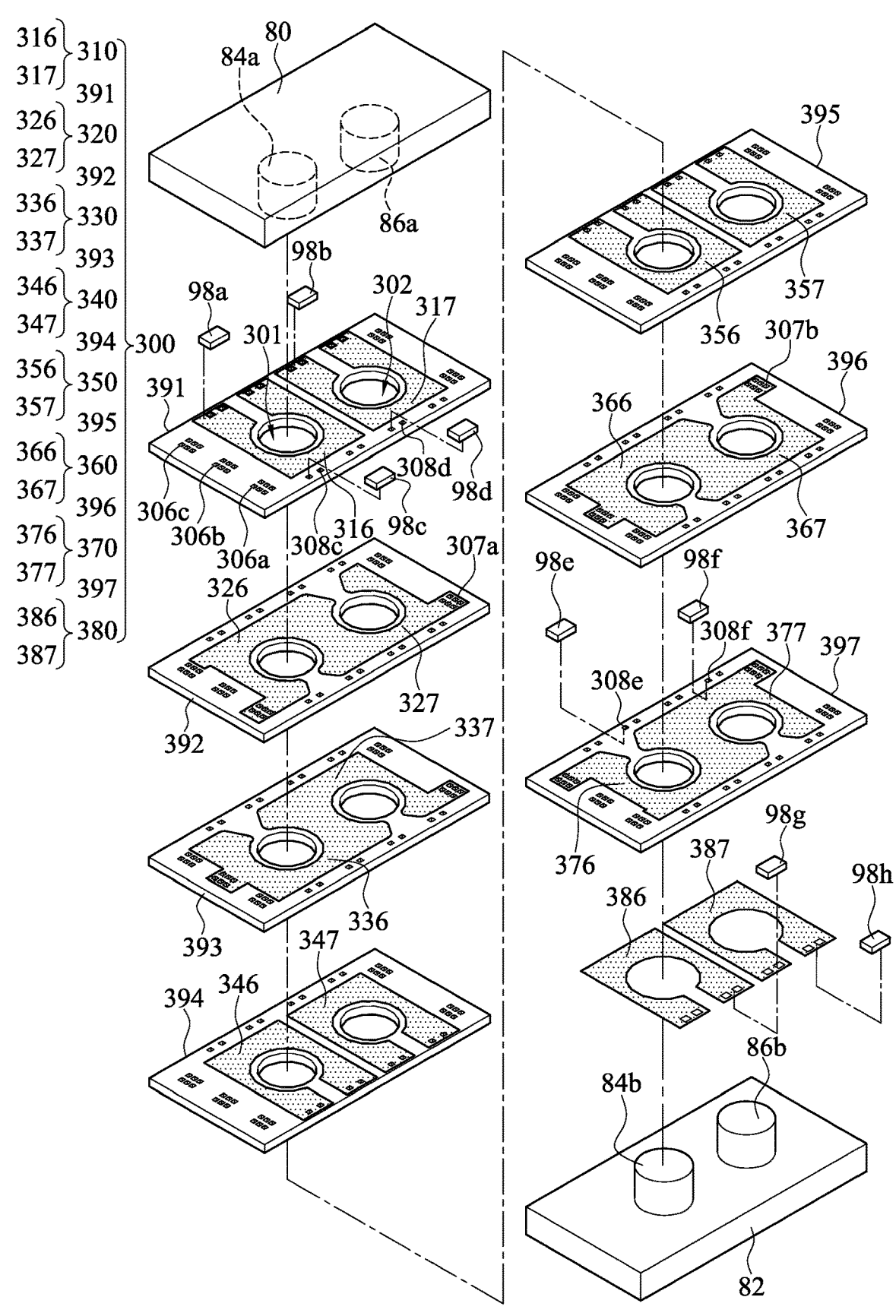
FIG. 10 is a three-dimensional exploded view of a planar transformer according to some embodiments.
Figure 11:
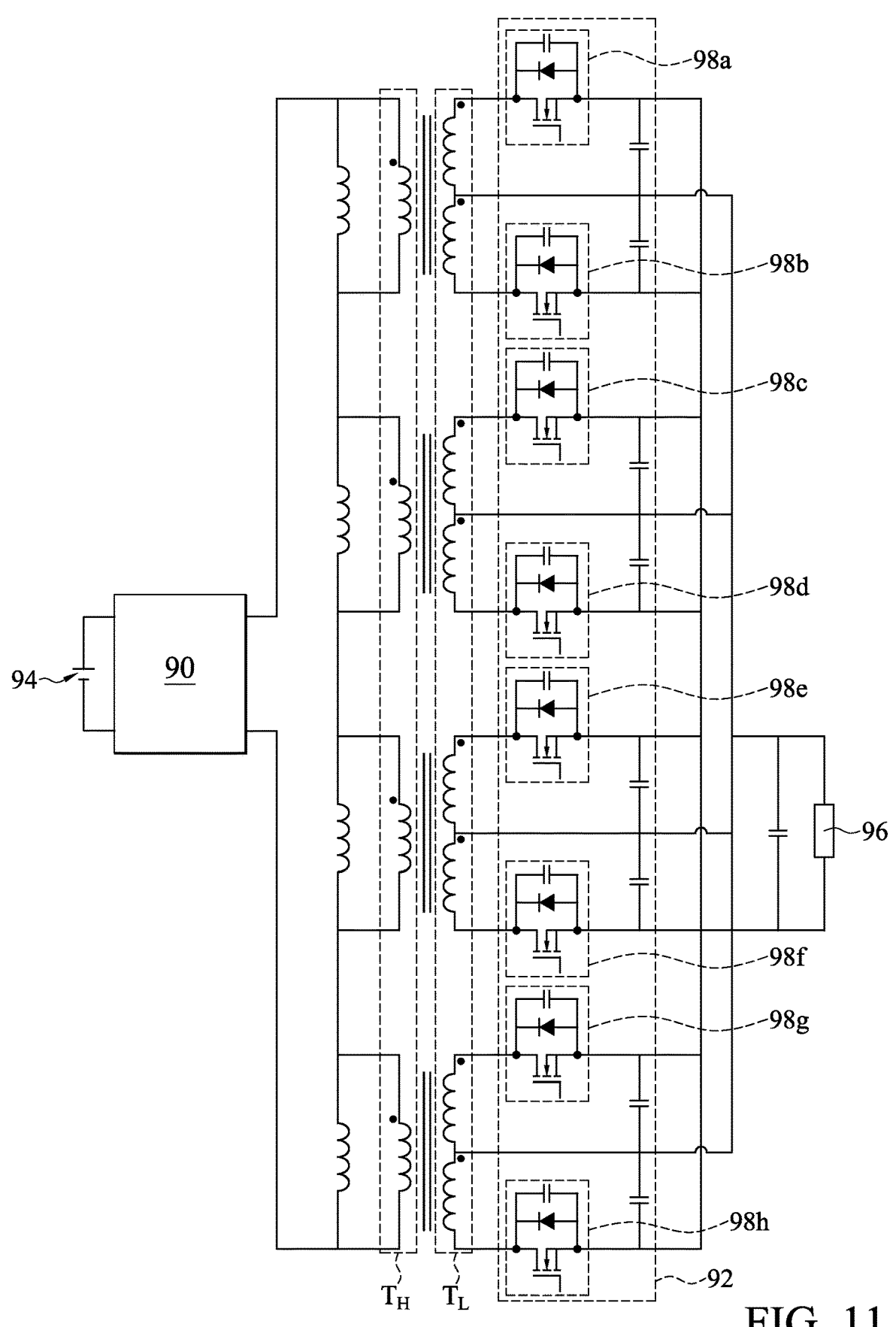
FIG. 11 is a circuit functional block diagram of the planar transformer in the embodiment of FIG. 10.

Referring to FIG. 10 and FIG. 11 together, FIG. 10 is a three-dimensional exploded view of a planar transformer according to some embodiments, and FIG. 11 is a circuit functional block diagram of the planar transformer in the embodiment of FIG. 10. The planar transformer includes a first magnetic core 80, a second magnetic core 82, two first sub-magnetic columns 84a and 84b, two second sub-magnetic columns 86a and 86b, and a printed circuit board 300. The printed circuit board 300 is an eight-layer board and includes a first column hole 301 and a second column hole 302. The first sub-magnetic columns 84a and 84b and the second sub-magnetic columns 86a and 86b are located in the first column hole 301 and the second column hole 302 respectively. The printed circuit board 300 includes seven insulating layers and eight winding layers, which are a first layer 310 (a short name of a first winding layer, and the same below), a first insulating layer 391, a second layer 320, a second insulating layer 392, a third layer 330, a third insulating layer 393, a fourth layer 340, a fourth insulating layer 394, a fifth layer 350, a fifth insulating layer 395, a sixth layer 360, a sixth insulating layer 396, a seventh layer 370, a seventh insulating layer 397, and an eighth layer 380 sequentially from top to bottom. The printed circuit board 300 includes three first conductive holes 306a, 306b, and 306c, and two second conductive holes 307a and 307b. The first conductive holes 306a, 306b, and 306c run through first extending regions (not shown in the figure), and the second conductive holes 307a and 307b run through second extending regions (not shown in the figure). The first conductive holes are a first sub-conductive hole 306a, a second sub-conductive hole 306b, and a third sub-conductive hole 306c respectively. The second conductive holes are a fourth sub-conductive hole 307a and a fifth sub-conductive hole 307b respectively.

In this embodiment, a first winding 326 of the second layer 320 is electrically connected to the first sub-conductive hole 306a, and a second winding 327 of the second layer 320 is electrically connected to the fourth sub-conductive hole 307a. A first winding 336 of the third layer 330 is electrically connected to the second sub-conductive hole 306b, and a second winding 337 of the third layer 330 is electrically connected to the fourth sub-conductive hole 307a. A first winding 366 of the sixth layer 360 is electrically connected to the second sub-conductive hole 306b, and a second winding 367 of the sixth layer 360 is electrically connected to the fifth sub-conductive hole 307b. A first winding 376 of the seventh layer 370 is electrically connected to the third sub-conductive hole 306c, and a second winding 377 of the seventh layer 370 is electrically connected to the fifth sub-conductive hole 307b.

Therefore, the first winding 326 of the second layer 320, the second winding 327 of the second layer 320, one 307a (the fourth sub-conductive hole 307a) of the second conductive holes, the second winding 337 of the third layer 330, the first winding 336 of the third layer 330, the second sub-conductive hole 306b, the first winding 366 of the sixth layer 360, the second winding 367 of the sixth layer 360, another one 307b (the fifth sub-conductive hole 307b) of the second conductive holes, the second winding 377 of the seventh layer 370, and the first winding 376 of the seventh layer 370 are connected in series sequentially to form a high voltage side coil $T_H$, and two ends of the high voltage side coil $T_H$ are the first sub-conductive hole 306a and the third sub-conductive hole 306c respectively. Therefore, inferring from the foregoing experiments, a total quantity of winding turns of the high voltage side coil $T_H$ is about 4.

First and second windings 316 and 317 of the first layer 310, first and second windings 346 and 347 of the fourth layer 340, first and second windings 356 and 357 of the fifth layer 350, and first and second windings 386 and 387 of the eighth layer 380 are low voltage side coils $T_L$, and quantities of winding turns are 1 respectively (with a relatively small opening). Therefore, inferring from the foregoing experiments, a turns ratio of the high voltage side coil $T_H$ to the low voltage side coils $T_L$ is 4:1:1:1:1:1:1:1:1. A high voltage side circuit 90 is electrically connected to the first sub-conductive hole 306a and the third sub-conductive hole 306c. Four synchronous rectification circuits 98a, 98b, 98c, and 98d of a low voltage side circuit 92 are located on two sides of an upper surface of the first insulating layer 391 respectively, and other four synchronous rectification circuits 98e, 98f, 98g, and 98h of the low voltage side circuit 92 are located on two sides of a lower surface of the seventh insulating layer 397 respectively. The synchronous rectification circuits 98a, 98b, 98c, 98d, 98e, 98f, 98g, and 98h are electrically connected to the corresponding windings 316, 317, 346, 347, 356, 357, 386, and 387 of the low voltage side coils $T_L$. Specifically, the synchronous rectification circuits 98a and 98b are electrically connected to the first and second windings 316 and 317 of the first layer 310 respectively, the synchronous rectification circuit 98c is electrically connected to the first winding 346 of the fourth layer 340 through a conductive hole 308c, the synchronous rectification circuit 98d is electrically connected to the second winding 347 of the fourth layer 340 through a conductive hole 308d, the synchronous rectification circuit 98e is electrically connected to the first winding 356 of the fifth layer 350 through a conductive hole 308e, the synchronous rectification circuit 98f is electrically connected to the second winding 357 of the fifth layer 350 through a conductive hole 308f, and the synchronous rectification circuits 98g and 98h are electrically connected to the first and second windings 386 and 387 of the eighth layer 380 respectively. The conductive hole 308c is not electrically connected to the first winding 386 of the eighth layer 380, the conductive hole 308d is not electrically connected to the second winding 387 of the eighth layer 380, the conductive hole 308e is not electrically connected to the first winding 316 of the first layer 310, and the conductive hole 308f is not electrically connected to the second winding 317 of the first layer 310.

Figure 12:
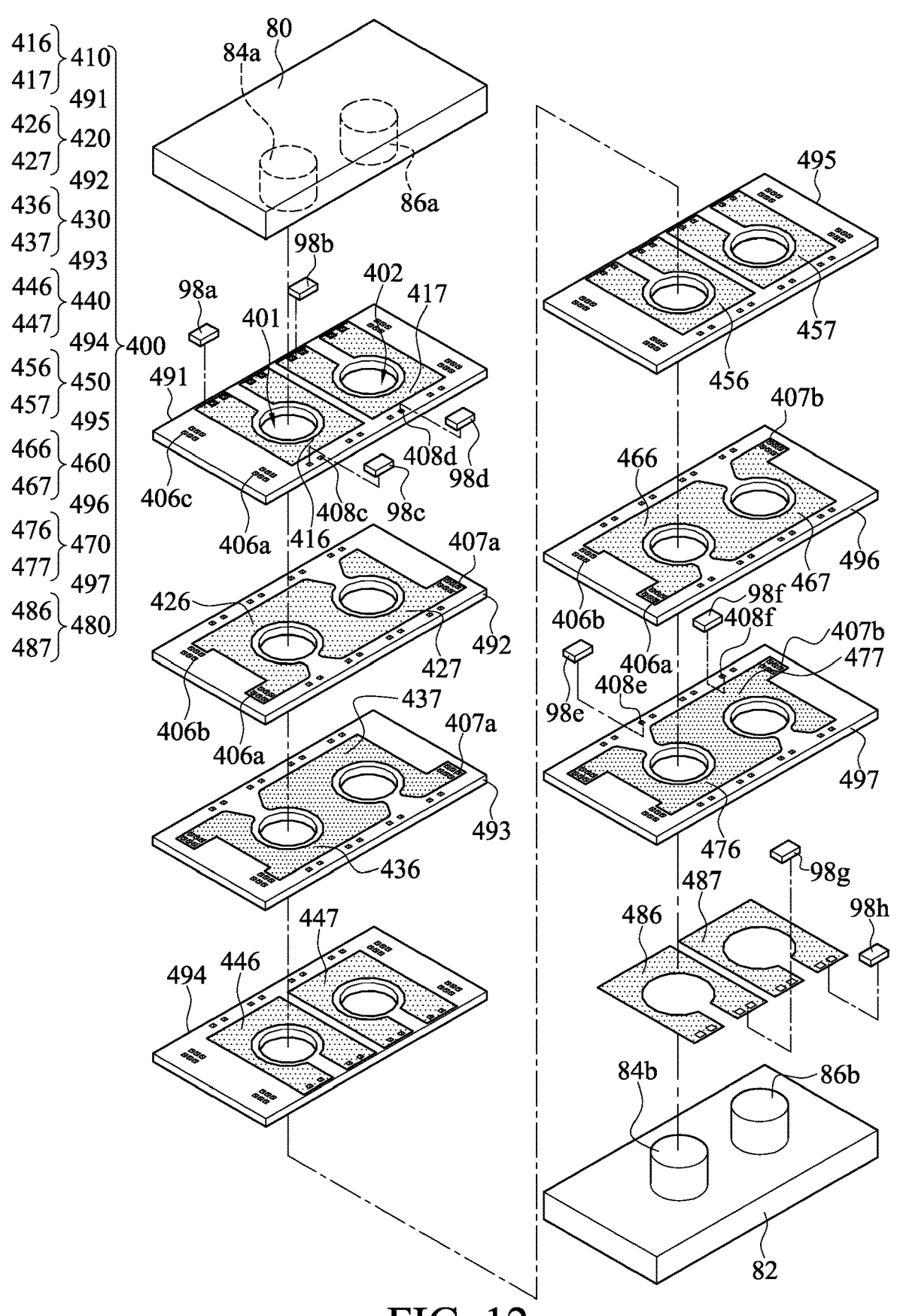
FIG. 12 is a three-dimensional exploded view of a planar transformer according to some embodiments.
Figure 13:
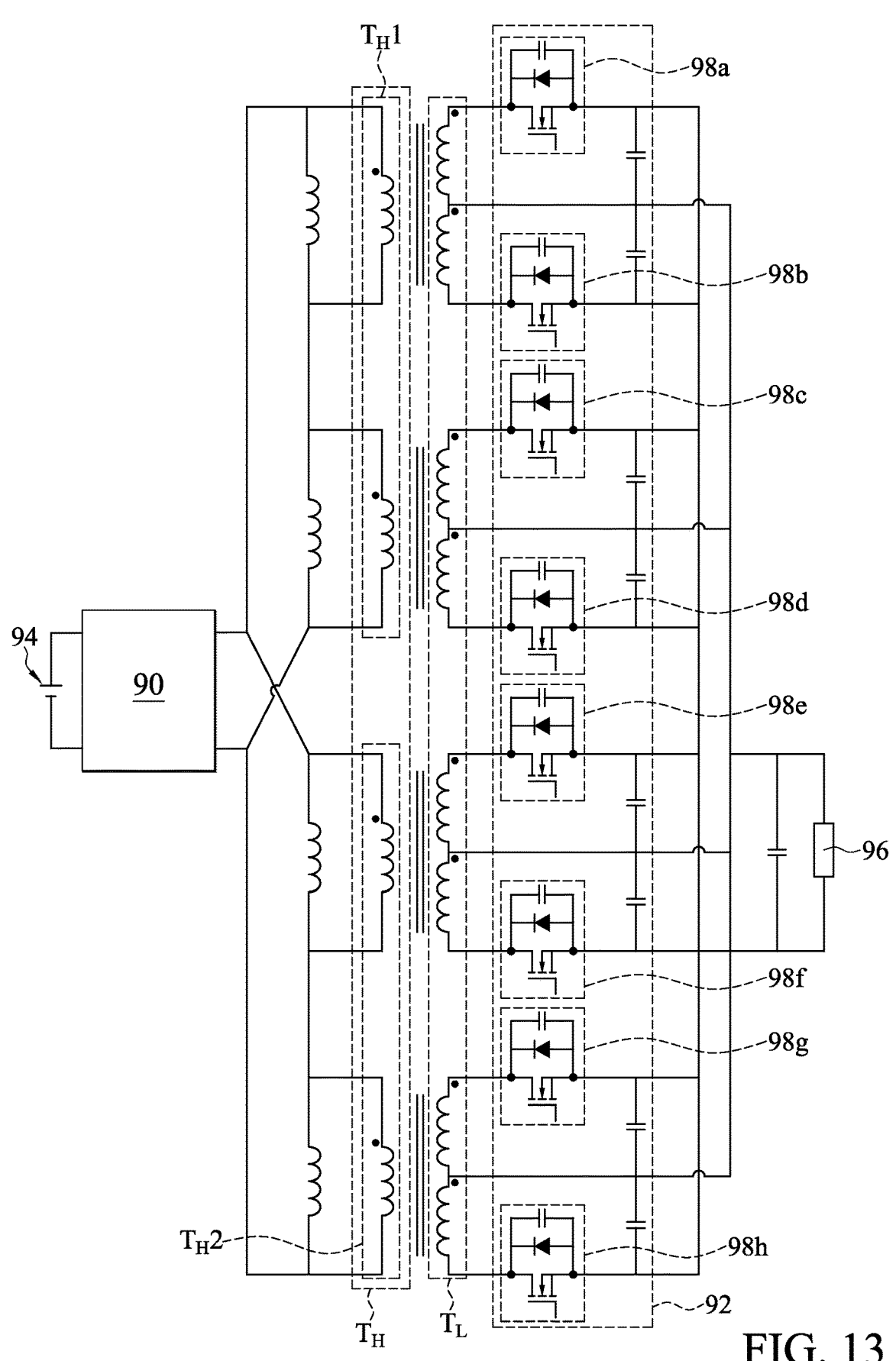
FIG. 13 is a circuit functional block diagram of the planar transformer in the embodiment of FIG. 12.

Referring to FIG. 12 and FIG. 13 together, FIG. 12 is a three-dimensional exploded view of a planar transformer according to some embodiments, and FIG. 13 is a circuit functional block diagram of the planar transformer in the embodiment of FIG. 12. The planar transformer includes a first magnetic core 80, a second magnetic core 82, two first sub-magnetic columns 84a and 84b, two second sub-magnetic columns 86a and 86b, and a printed circuit board 400. The printed circuit board 400 is an eight-layer board and includes a first column hole 401 and a second column hole 402. The first sub-magnetic columns 84a and 84b and the second sub-magnetic columns 86a and 86b are located in the first column hole 401 and the second column hole 402 respectively. The printed circuit board 400 includes seven insulating layers and eight winding layers, which are a first layer 410 (a short name of a first winding layer, and the same below), a first insulating layer 491, a second layer 420, a second insulating layer 492, a third layer 430, a third insulating layer 493, a fourth layer 440, a fourth insulating layer 494, a fifth layer 450, a fifth insulating layer 495, a sixth layer 460, a sixth insulating layer 496, a seventh layer 470, a seventh insulating layer 497, and an eighth layer 480 sequentially from top to bottom. The printed circuit board includes two first conductive holes 406a and 406b (which may be referred to as a first sub-conductive hole 406a and a second sub-conductive hole 406b respectively) and two second conductive holes 407a and 407b (which may be referred to as a fourth sub-conductive hole 407a and a fifth sub-conductive hole 407b respectively). The two first conductive holes 406a and 406b run through first extending regions (not shown in the figure), and the two second conductive holes 407a and 407b run through second extending regions (not shown in the figure).

In this embodiment, a first winding 426 of the second layer 420 is electrically connected to one 406a (the first sub-conductive hole 406a) of the two first conductive holes, and a second winding 427 of the second layer 420 is electrically connected to one 407a (the fourth sub-conductive hole 407a) of the two second conductive holes. A first winding 436 of the third layer 430 is electrically connected to the other 406b (the second sub-conductive hole 406b) of the two first conductive holes, and a second winding 437 of the third layer 430 is electrically connected to the one 407a (the fourth sub-conductive hole 407a) of the two second conductive holes. A first winding 466 of the sixth layer 460 is electrically connected to the one 406a (the first sub-conductive hole 406a) of the two first conductive holes, and a second winding 467 of the sixth layer 460 is electrically connected to the other 407b (the fifth sub-conductive hole 407b) of the two second conductive holes. A first winding 476 of the seventh layer 470 is electrically connected to the other 406*b* (the second sub-conductive hole 406*b*) of the two first conductive holes, and a second winding 477 of the seventh layer 470 is electrically connected to the other 407*b* (the fifth sub-conductive hole 407*b*) of the two second conductive holes.

Therefore, the first winding 426 of the second layer 420, the second winding 427 of the second layer 420, the second conductive hole 407*a*, the second winding 437 of the third layer 430, and the first winding 436 of the third layer 430 are electrically connected sequentially to form a first coil $T_H1$, and two ends of the first coil $T_H1$ are electrically connected to the two first conductive holes 406*a* and 406*b* respectively. Therefore, inferring from the foregoing experiments, a total quantity of winding turns of the first coil $T_H1$ is about 2. In addition, the first winding 466 of the sixth layer 460, the second winding 467 of the sixth layer 460, the second conductive hole 407*b*, the second winding 477 of the seventh layer 470, and the first winding 476 of the seventh layer 470 are electrically connected sequentially to form a second coil $T_H2$. Two ends of the second coil $T_H2$ are electrically connected to the two first conductive holes 406*a* and 406*b* respectively. Therefore, inferring from the foregoing experiments, a total quantity of winding turns of the second coil $T_H2$ is about 2. The first coil $T_H1$ and the second coil $T_H2$ are connected in parallel through the two first conductive holes 406*a* and 406*b* to form a high voltage side coil $T_H$.

First and second windings 416 and 417 of the first layer 410, first and second windings 446 and 447 of the fourth layer 440, first and second windings 456 and 457 of the fifth layer 450, and first and second windings 486 and 487 of the eighth layer 480 are low voltage side coils $T_L$. Inferring from the foregoing experiments, quantities of winding turns thereof are 1 respectively (with a relatively small opening). Therefore, turns ratios of the high voltage side coils $T_H$ to the low voltage side coils $T_L$ are 2:1:1:1:1 and 2:1:1:1:1. A high voltage side circuit 90 is electrically connected to the two first conductive holes 406*a* and 406*b*. Synchronous rectification circuits 98*a*, 98*b*, 98*c*, and 98*d* of a low voltage side circuit 92 are located on two sides of an upper surface of the first insulating layer 491 respectively, and other four synchronous rectification circuits 98*e*, 98*f*, 98*g*, and 98*h* of the low voltage side circuit 92 are located on two sides of a lower surface of the seventh insulating layer 497 respectively. The synchronous rectification circuits 98*a*, 98*b*, 98*c*, 98*d*, 98*e*, 98*f*, 98*g*, and 98*h* are electrically connected to the corresponding windings 416, 417, 446, 447, 456, 457, 486, and 487 of the low voltage side coils $T_L$. Similar to the embodiment of FIG. 10, the synchronous rectification circuits 98*c*, 98*d*, 98*e*, and 98*f* of FIG. 12 are electrically connected to the corresponding windings 446, 447, 456, and 457 respectively through 408*c*, 408*d*, 408*e*, and 408*f*, and details are not described herein again.

Implementation forms such as the S shape (or reverse S shape) substantially presented by the foregoing first or second line shape include, but are not limited to, the first and second windings 116 and 117 of the first layer 110 in FIG. 2A, the first and second windings 126 and 127 of the second layer 120 in FIG. 2A, the first and second windings 116 and 117 of the first layer 110 in FIG. 3A, the first and second windings 126 and 127 of the second layer 120 in FIG. 3A, the first and second windings 136 and 137 of the third layer 130 in FIG. 3A, the first and second windings 116*m* and 117*m* of the first layer 110*m* in FIG. 4A, the first and second windings 126*m* and 127*m* of the second layer 120*m* in FIG. 4A, the first and second windings 136*m* and 137*m* of the third layer 130*m* in FIG. 4A, the first and second windings 166 and 167 in FIG. 5A, the first and second windings 116*r* and 117*r* of the first layer 110*r* in FIG. 6, the first and second windings 126*r* and 127*r* of the second layer 120*r* in FIG. 6, the first and second windings 226 and 227 of the second layer 220 in FIG. 7, the first and second windings 236 and 237 of the third layer 230 in FIG. 7, the first and second windings 326 and 327 of the second layer 320 in FIG. 10, the first and second windings 336 and 337 of the third layer 330 in FIG. 10, the first and second windings 366 and 367 of the sixth layer 360 in FIG. 10, the first and second windings 376 and 377 of the seventh layer 370 in FIG. 10, the first and second windings 426 and 427 of the second layer 420 in FIG. 12, the first and second windings 436 and 437 of the third layer 430 in FIG. 12, the first and second windings 466 and 467 of the sixth layer 460 in FIG. 12, and the first and second windings 476 and 477 of the seventh layer 470 in FIG. 12. Second, in the foregoing implementation forms, the winding direction of the first winding and the winding direction of the second winding that are on the same layer are opposite.

Based on the above, in some embodiments, a winding layer of the planar transformer include a first winding and a second winding that are connected in series. The first winding and the second winding have different opening directions. A winding direction in which the first winding surrounds the first column hole is opposite to a winding direction in which the second winding surrounds the second column hole. Therefore, a designer may adjust opening directions of windings to cooperate with a high voltage side circuit, a low voltage side circuit, and a circuit layout requirement, to increase the design flexibility. In some embodiments, the conductive holes run through the extending regions, and the windings of the plurality of winding layers are electrically connected through the conductive holes. In this way, the conductive holes do not need to be configured in the column winding region, so that circuit layout is more flexible. In some embodiments, the conductive holes are all plated through holes, so that the printed circuit board of the planar transformer has no buried via hole or blind via hole, so that the printed circuit board has lower manufacture costs, a high yield rate, and high reliability.

What is claimed is:

1. A planar transformer, comprising:

a printed circuit board, wherein the printed circuit board comprises a plurality of winding layers, a first column hole, a second column hole, two first conductive holes, and a second conductive hole, each winding layer comprises a first column winding region, a second column winding region, a first extending region, and a second extending region, the first column hole passes through the first column winding regions, the second column hole passes through the second column winding regions, the first conductive holes run through the first extending regions, the second conductive hole passes through the second extending regions, and the winding layers comprise:

a first layer, comprising a first winding and a second winding, wherein the first winding of the first layer is in the first column winding region of the first layer and surrounds the first column hole, and the second winding of the first layer is in the second column winding region of the first layer and surrounds the second column hole;

a second layer, comprising a first winding and a second winding, wherein the first winding of the second layer is in the first column winding region of the second layer, surrounds the first column hole, and has a first opening direction, the second winding of the second layer is in the second column winding region of the second layer, surrounds the second column hole, and has a second opening direction, the first winding of the second layer is electrically connected to the second winding of the second layer, the first opening direction of the second layer is different from the second opening direction of the second layer, the first winding of the second layer extends to the first extending region of the second layer and is electrically connected to one of the two first conductive holes, and the second winding of the second layer extends to the second extending region of the second layer and is electrically connected to the second conductive hole;

a third layer, comprising a first winding and a second winding, wherein the first winding of the third layer is in the first column winding region of the third layer, surrounds the first column hole, and has a first opening direction, the second winding of the third layer is in the second column winding region of the third layer, surrounds the second column hole, and has a second opening direction, the first winding of the third layer is electrically connected to the second winding of the third layer, the first opening direction of the third layer is different from the second opening direction of the third layer, the first winding of the third layer extends to the first extending region of the third layer and is electrically connected to the other of the two first conductive holes, and the second winding of the third layer extends to the second extending region of the third layer and is electrically connected to the second conductive hole; and a fourth layer, comprising a first winding and a second winding, wherein the first winding of the fourth layer is in the first column winding region of the fourth layer and surrounds the first column hole, and the second winding of the fourth layer is in the second column winding region of the fourth layer and surrounds the second column hole;

a high voltage side circuit, electrically connected to the two first conductive holes; and a low voltage side circuit, electrically connected to the first winding of the first layer, the second winding of the first layer, the first winding of the fourth layer, and the second winding of the fourth layer.

2. The planar transformer according to claim 1, wherein the low voltage side circuit comprises four sets of output ends, the output ends respectively correspond to the first winding of the first layer, the second winding of the first layer, the first winding of the fourth layer, and the second winding of the fourth layer, and the four sets of output ends are connected in parallel.

3. The planar transformer according to claim 1, wherein the winding layers additionally comprise:

a fifth layer, comprising a first winding and a second winding, wherein the first winding of the fifth layer is in the first column winding region of the fifth layer and surrounds the first column hole, and the second winding of the fifth layer is in the second column winding region of the fifth layer and surrounds the second column hole;

a sixth layer, comprising a first winding and a second winding, wherein the first winding of the sixth layer is in the first column winding region of the sixth layer, surrounds the first column hole, and has a first opening direction, the second winding of the sixth layer is in the second column winding region of the sixth layer, surrounds the second column hole, and has a second opening direction, the first winding of the sixth layer is electrically connected to the second winding of the sixth layer, the first opening direction of the sixth layer is different from the second opening direction of the sixth layer, the first winding of the sixth layer extends to the first extending region of the sixth layer and is electrically connected to the one of the two first conductive holes, and the second winding of the sixth layer extends to the second extending region of the sixth layer and is electrically connected to the second conductive hole; and a seventh layer, comprising a first winding and a second winding, wherein the first winding of the seventh layer is in the first column winding region of the seventh layer, surrounds the first column hole, and has a first opening direction, the second winding of the seventh layer is in the second column winding region of the seventh layer, surrounds the second column hole, and has a second opening direction, the first winding of the seventh layer is electrically connected to the second winding of the seventh layer, the first opening direction of the seventh layer is different from the second opening direction of the seventh layer, the first winding of the seventh layer extends to the first extending region of the seventh layer and is electrically connected to the other of the two first conductive holes, and the second winding of the seventh layer extends to the second extending region of the seventh layer and is electrically connected to the second conductive hole; and an eighth layer, comprising a first winding and a second winding, wherein the first winding of the eighth layer is in the first column winding region of the eighth layer and surrounds the first column hole, and the second winding of the eighth layer is in the second column winding region of the eighth layer and surrounds the second column hole, wherein the low voltage side circuit is electrically connected to the first winding of the fifth layer, the second winding of the fifth layer, the first winding of the eighth layer, and the second winding of the eighth layer.

4. A planar transformer, comprising:

a printed circuit board, wherein the printed circuit board comprises a plurality of winding layers, a first column hole, a second column hole, three first conductive holes, and two second conductive holes, each winding layer comprises a first column winding region, a second column winding region, a first extending region, and a second extending region, the first column hole passes through the first column winding regions, the second column hole passes through the second column winding regions, the first conductive holes run through the first extending regions, the second conductive holes run through the second extending regions, the first conductive holes are respectively a first sub-conductive hole, a second sub-conductive hole, and a third sub-conductive hole, the second conductive holes are respectively a fourth sub-conductive hole and a fifth sub-conductive hole, and the winding layers comprise:

a first layer, comprising a first winding and a second winding, wherein the first winding of the first layer is in the first column winding region of the first layer and surrounds the first column hole, and the second winding of the first layer is in the second column winding region of the first layer and surrounds the second column hole;

a second layer, comprising a first winding and a second winding, wherein the first winding of the second layer is in the first column winding region of the second layer, surrounds the first column hole, and has a first opening direction, the second winding of the second layer is in the second column winding region of the second layer, surrounds the second column hole, and has a second opening direction, the first winding of the second layer is electrically connected to the second winding of the second layer, the first opening direction of the second layer is different from the second opening direction of the second layer, the first winding of the second layer extends to the first extending region of the second layer and is electrically connected to the first sub-conductive hole, and the second winding of the second layer extends to the second extending region of the second layer and is electrically connected to the fourth sub-conductive hole;

a third layer, comprising a first winding and a second winding, wherein the first winding of the third layer is in the first column winding region of the third layer, surrounds the first column hole, and has a first opening direction, the second winding of the third layer is in the second column winding region of the third layer, surrounds the second column hole, and has a second opening direction, the first winding of the third layer is electrically connected to the second winding of the third layer, the first opening direction of the third layer is different from the second opening direction of the third layer, the first winding of the third layer extends to the first extending region of the third layer and is electrically connected to the second sub-conductive hole, and the second winding of the third layer extends to the second extending region of the third layer and is electrically connected to the fourth sub-conductive hole;

a fourth layer, comprising a first winding and a second winding, wherein the first winding of the fourth layer is in the first column winding region of the fourth layer and surrounds the first column hole, and the second winding of the fourth layer is in the second column winding region of the fourth layer and surrounds the second column hole;

a fifth layer, comprising a first winding and a second winding, wherein the first winding of the fifth layer is in the first column winding region of the fifth layer and surrounds the first column hole, and the second winding of the fifth layer is in the second column winding region of the fifth layer and surrounds the second column hole;

a sixth layer, comprising a first winding and a second winding, wherein the first winding of the sixth layer is in the first column winding region of the sixth layer, surrounds the first column hole, and has a first opening direction, the second winding of the sixth layer is in the second column winding region of the sixth layer, surrounds the second column hole, and has a second opening direction, the first winding of the sixth layer is electrically connected to the second winding of the sixth layer, the first opening direction of the sixth layer is different from the second opening direction of the sixth layer, the first winding of the sixth layer extends to the first extending region of the sixth layer and is electrically connected to the second sub-conductive hole, and the second winding of the sixth layer extends to the second extending region of the sixth layer and is electrically connected to the fifth sub-conductive hole;

a seventh layer, comprising a first winding and a second winding, wherein the first winding of the seventh layer is in the first column winding region of the seventh layer, surrounds the first column hole, and has a first opening direction, the second winding of the seventh layer is in the second column winding region of the seventh layer, surrounds the second column hole, and has a second opening direction, the first winding of the seventh layer is electrically connected to the second winding of the seventh layer, the first opening direction of the seventh layer is different from the second opening direction of the seventh layer, the first winding of the seventh layer extends to the first extending region of the seventh layer and is electrically connected to the third sub-conductive hole, and the second winding of the seventh layer extends to the second extending region of the seventh layer and is electrically connected to the fifth sub-conductive hole; and an eighth layer, comprising a first winding and a second winding, wherein the first winding of the eighth layer is in the first column winding region of the eighth layer and surrounds the first column hole, and the second winding of the eighth layer is in the second column winding region of the eighth layer and surrounds the second column hole;

a high voltage side circuit, electrically connected to the first sub-conductive hole and the third sub-conductive hole; and a low voltage side circuit, electrically connected to the first winding of the first layer, the second winding of the first layer, the first winding of the fourth layer, the second winding of the fourth layer, the first winding of the fifth layer, the second winding of the fifth layer, the first winding of the eighth layer, and the second winding of the eighth layer.

\* \* \* \* \*